United States Patent
Song et al.

(10) Patent No.: US 9,864,550 B2
(45) Date of Patent: Jan. 9, 2018

(54) METHOD AND APPARATUS OF RECOVERING AND ENCODING FOR DATA RECOVERY IN STORAGE SYSTEM

(71) Applicant: INDUSTRY-ACADEMIC COOPERATION FOUNDATION, YONSEI UNIVERSITY, Seoul (KR)

(72) Inventors: Hong Yeop Song, Seoul (KR); Jung Hyun Kim, Seoul (KR)

(73) Assignee: INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 10 days.

(21) Appl. No.: 15/085,960

(22) Filed: Mar. 30, 2016

(65) Prior Publication Data

US 2016/0350188 A1 Dec. 1, 2016

(30) Foreign Application Priority Data

May 29, 2015 (KR) .................. 10-2015-0076508

(51) Int. Cl.
*G11C 29/00* (2006.01)
*G06F 3/06* (2006.01)
*H03M 13/37* (2006.01)

(52) U.S. Cl.
CPC .............. *G06F 3/067* (2013.01); *G06F 3/064* (2013.01); *G06F 3/0619* (2013.01); *H03M 13/3761* (2013.01)

(58) Field of Classification Search
CPC ........ G06F 3/067; G06F 3/0619; G06F 3/064; H03M 13/3761
See application file for complete search history.

(56) References Cited

U.S. PATENT DOCUMENTS 4,211,997 A * 7/1980 Rudnick .......... G11B 20/10527
360/13

FOREIGN PATENT DOCUMENTS

KR 10-2011-0051527 A 5/2011

* cited by examiner

*Primary Examiner* — Sam Rizk

(57) ABSTRACT

Provided are a method and an apparatus of recovering and encoding for data recovery in a storage system and a distributed storage system of supporting, when a node storing data is lost in a distributed storage environment, a function to recover the lost node. According to exemplary embodiments of the present invention, in a method of encoding for recovering data loss in a distributed storage system, it is possible to guarantee jointly optimized locality with respect to a loss of two or more specific numbers of nodes and recover data of lost nodes in the distributed storage system by using a smaller number of nodes while using a smaller storage capacity.

20 Claims, 20 Drawing Sheets

[Fig.1a]
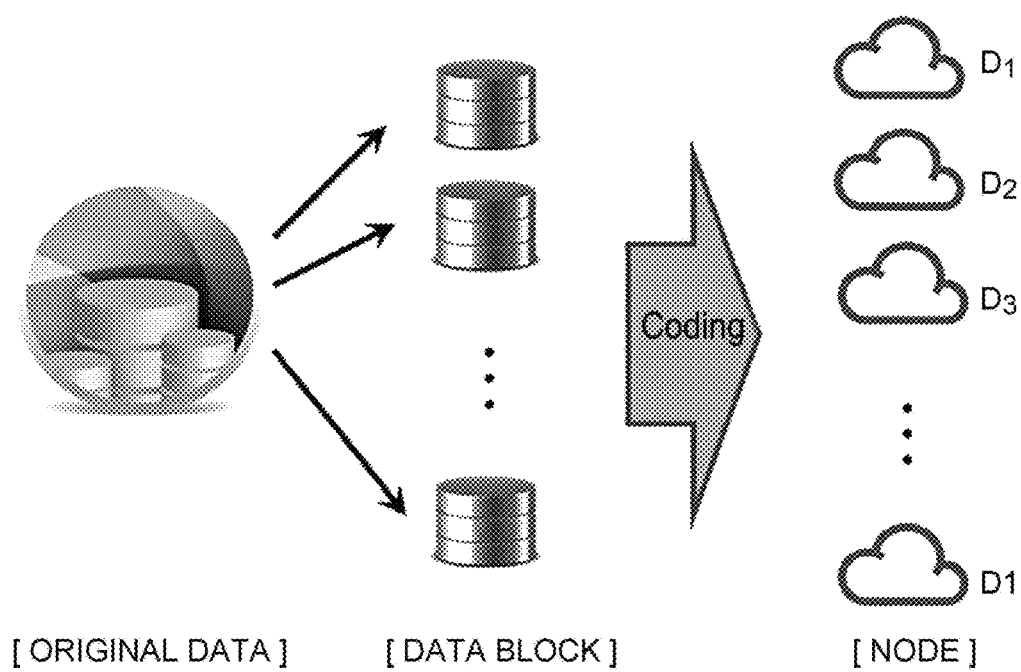
[ ORIGINAL DATA ]   [ DATA BLOCK ]   [ NODE ]

[Fig.1b]
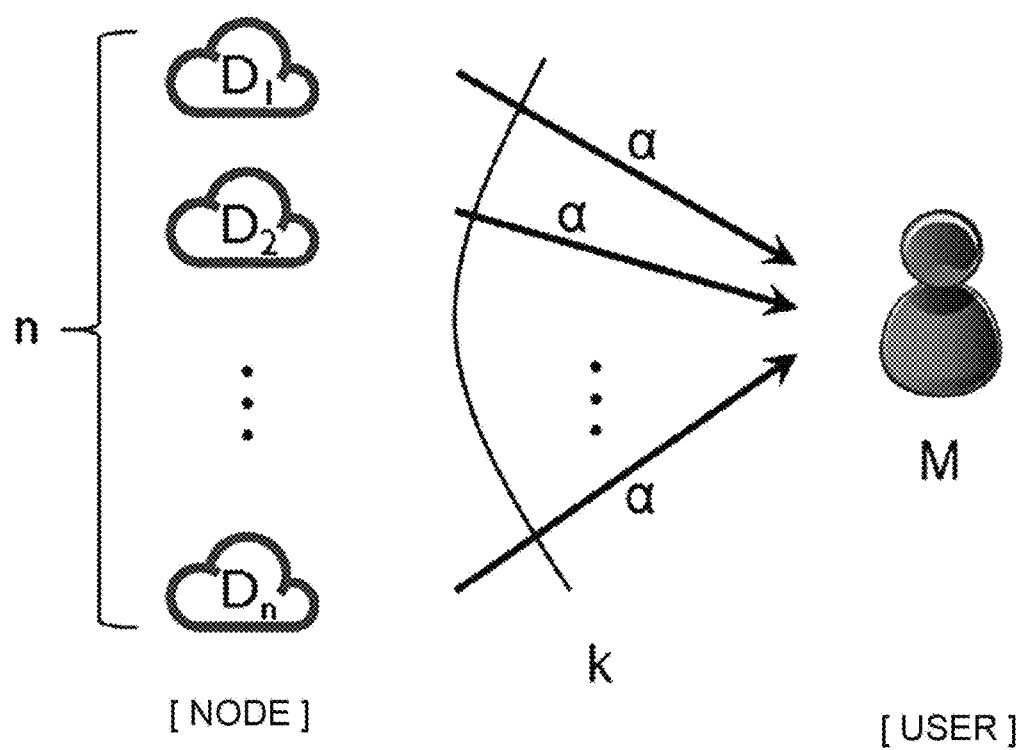

[Fig.1c]
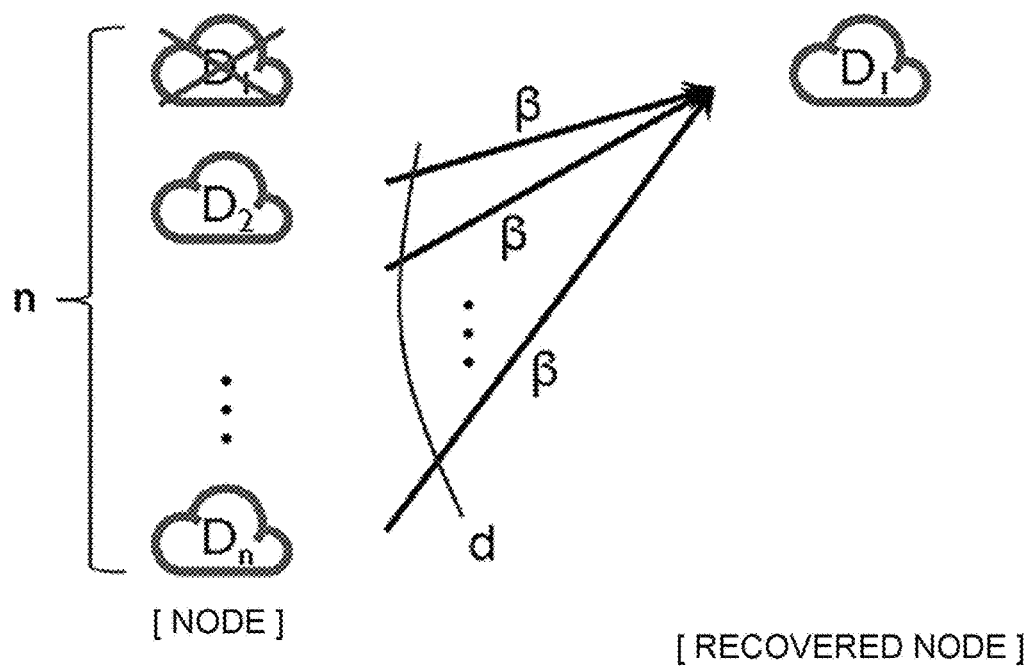

[Fig.2]
[ REPETITION ENCODING ]
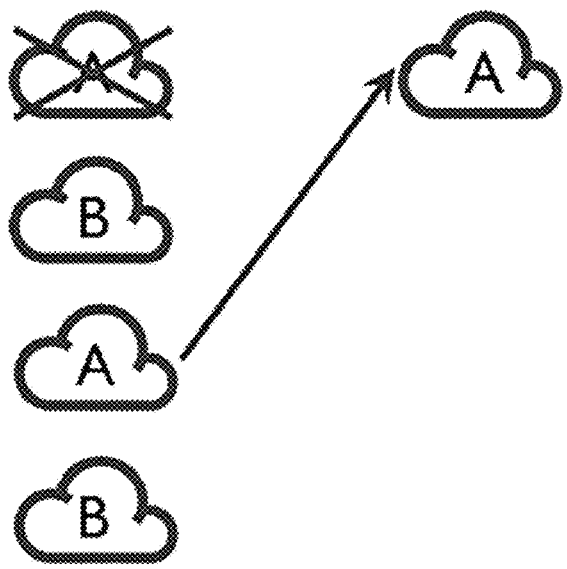

[Fig.3]
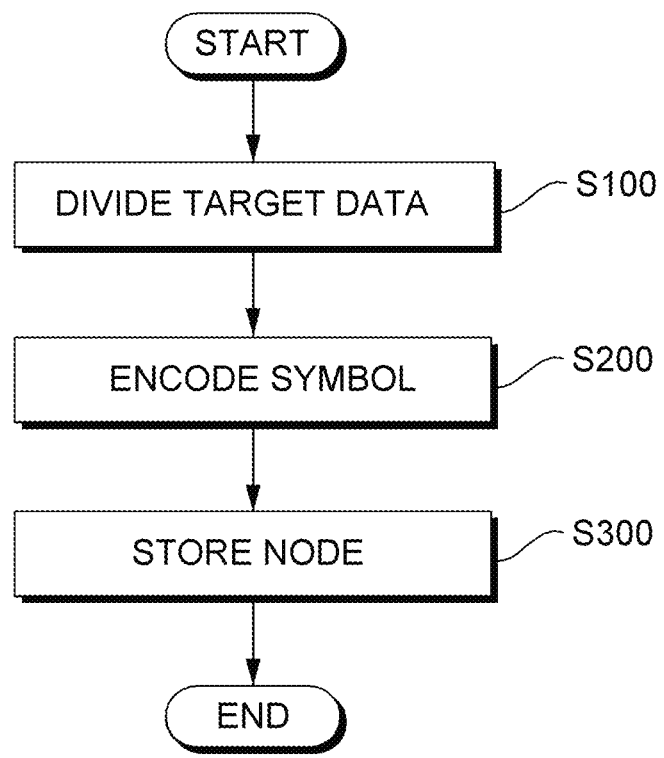

[Fig.4]
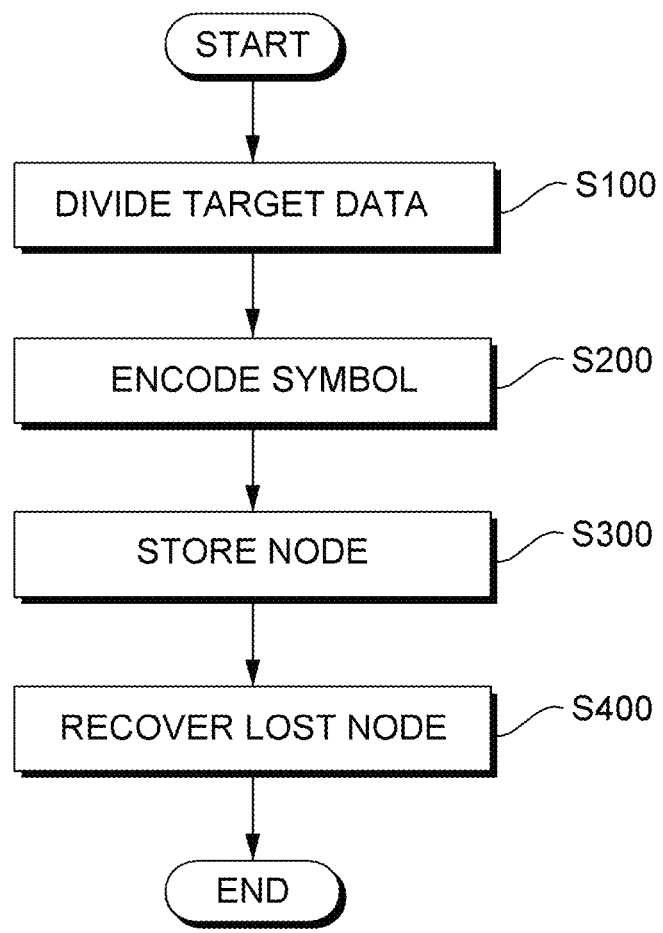

[Fig.5a]
[Fig.5b]
[Fig.5c]
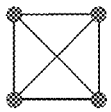
[Fig.5d]
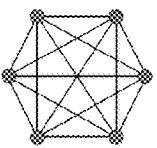

[Fig.6a]
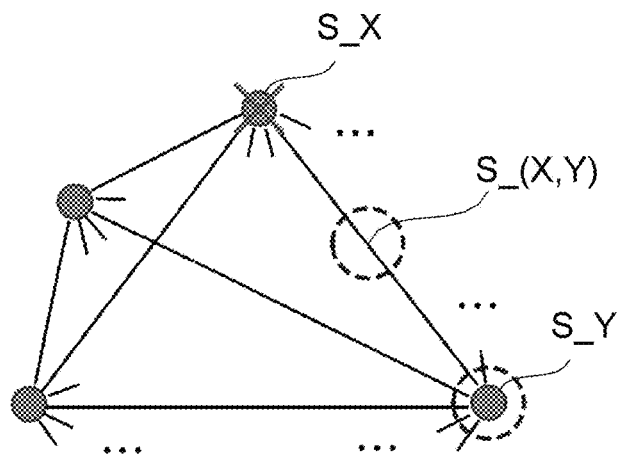
[Fig.6b]
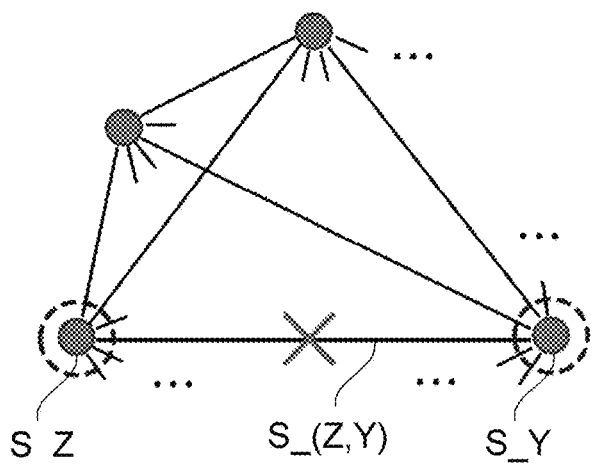

[Fig.7a]
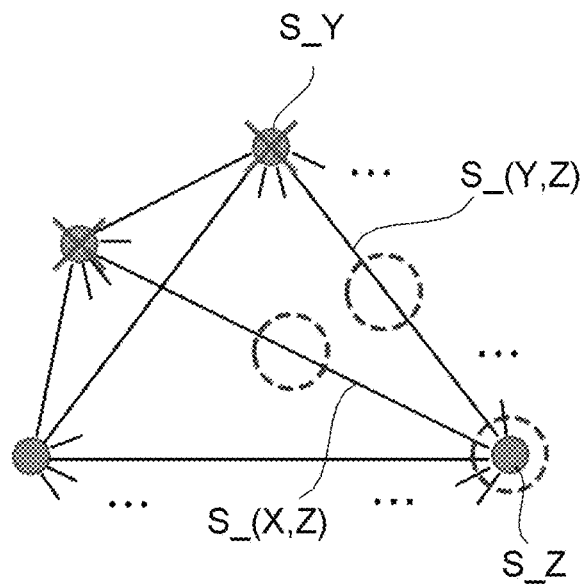
[Fig.7b]
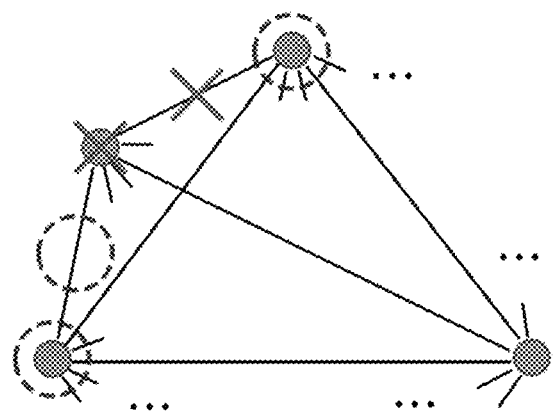

[Fig.7c]
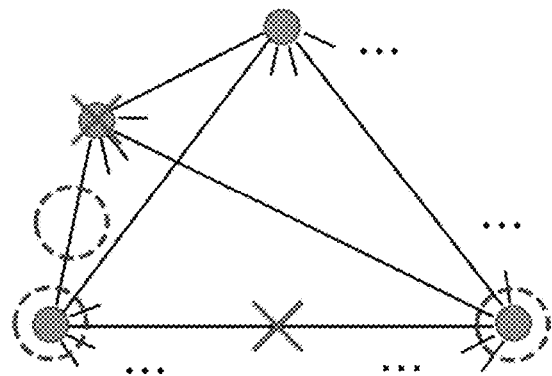
[Fig.7d]
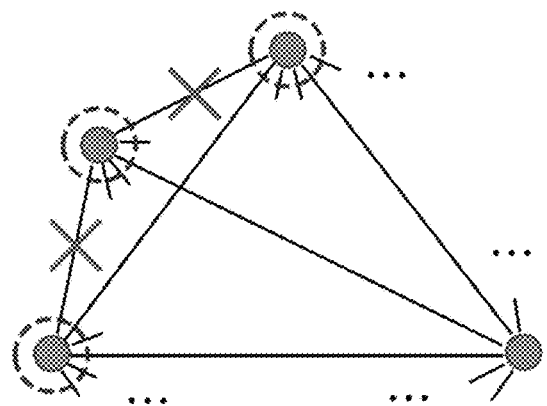
[Fig.7e]
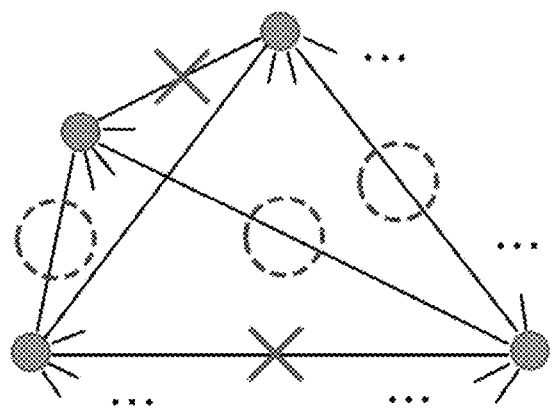

[Fig.8a]
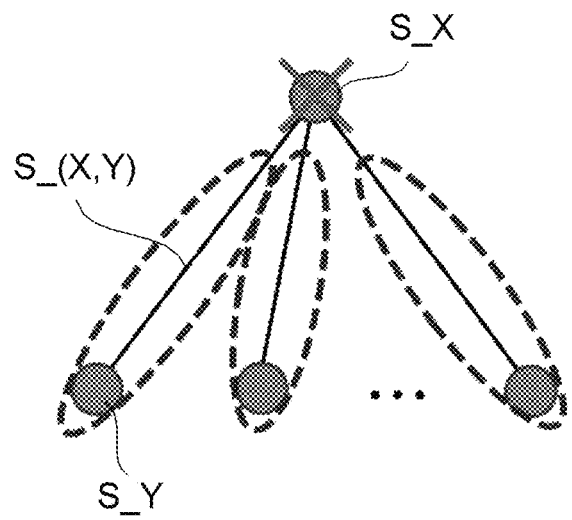
[Fig.8b]
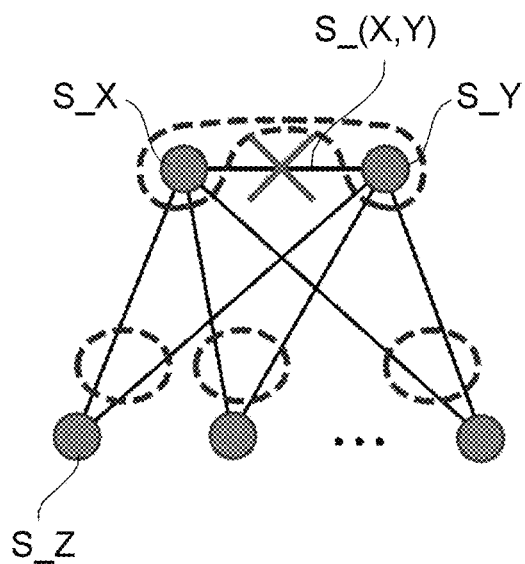

[Fig.9a]

| Codes | Graphs | Generator matrices |
|---|---|---|
| $[15,6,4]_2$ CMG code $(p=2, k=6)$ | | $\begin{pmatrix} 1 & 0 & 0 & 0 & 0 & 0 & 1 & 1 & 1 & 0 & 0 & 0 & 0 & 0 & 0 \\ 0 & 1 & 0 & 0 & 0 & 0 & 0 & 0 & 0 & 1 & 1 & 1 & 0 & 0 & 0 \\ 0 & 0 & 1 & 0 & 0 & 0 & 0 & 0 & 0 & 0 & 0 & 0 & 1 & 1 & 1 \\ 0 & 0 & 0 & 1 & 0 & 0 & 1 & 0 & 0 & 1 & 0 & 0 & 1 & 0 & 0 \\ 0 & 0 & 0 & 0 & 1 & 0 & 0 & 1 & 0 & 0 & 1 & 0 & 0 & 1 & 0 \\ 0 & 0 & 0 & 0 & 0 & 1 & 0 & 0 & 1 & 0 & 0 & 1 & 0 & 0 & 1 \end{pmatrix}$ |

[Fig.9b]

| Codes | Graphs | Generator matrices |
|---|---|---|
| $[18,6,5]_2$ CMG code $(p=3, k=6)$ | | $\begin{pmatrix} 1 & 0 & 0 & 0 & 0 & 0 & 1 & 1 & 1 & 1 & 0 & 0 & 0 & 0 & 0 & 0 & 0 & 0 \\ 0 & 1 & 0 & 0 & 0 & 0 & 0 & 0 & 0 & 0 & 1 & 1 & 1 & 1 & 0 & 0 & 0 & 0 \\ 0 & 0 & 1 & 0 & 0 & 0 & 1 & 0 & 0 & 0 & 1 & 0 & 0 & 0 & 1 & 1 & 0 & 0 \\ 0 & 0 & 0 & 1 & 0 & 0 & 0 & 1 & 0 & 0 & 0 & 1 & 0 & 0 & 0 & 0 & 1 & 1 \\ 0 & 0 & 0 & 0 & 1 & 0 & 0 & 0 & 1 & 0 & 0 & 0 & 1 & 0 & 1 & 0 & 1 & 0 \\ 0 & 0 & 0 & 0 & 0 & 1 & 0 & 0 & 0 & 1 & 0 & 0 & 0 & 1 & 0 & 1 & 0 & 1 \end{pmatrix}$ |

[Fig.10a]
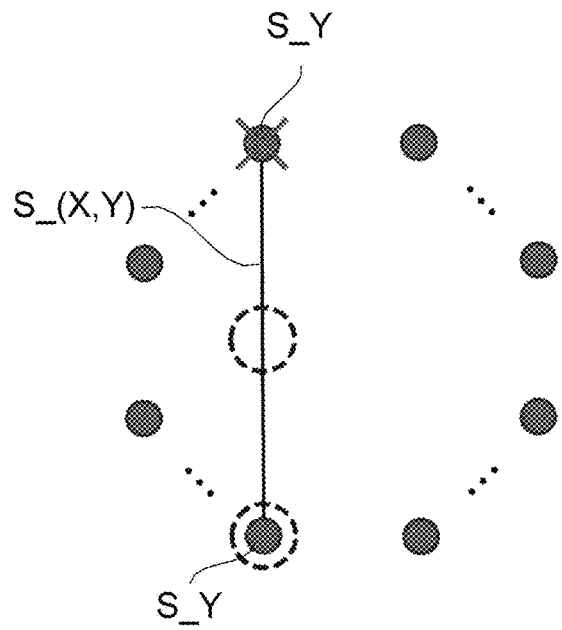
[Fig.10b]
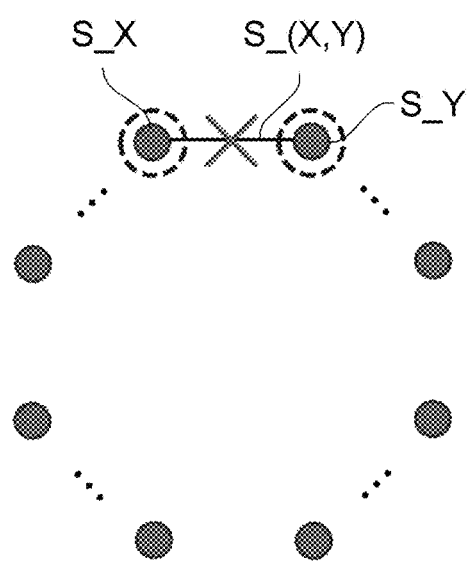

[Fig.11a]
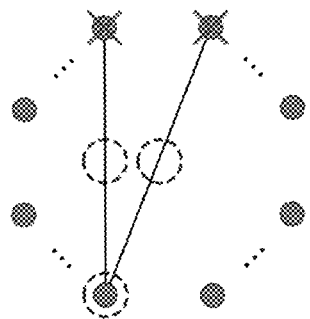
[Fig.11b]
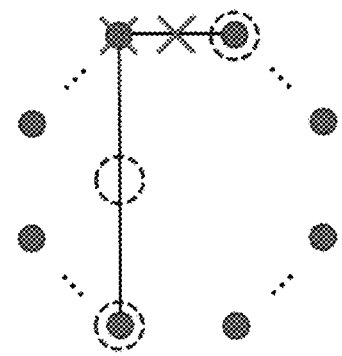
[Fig.11c]
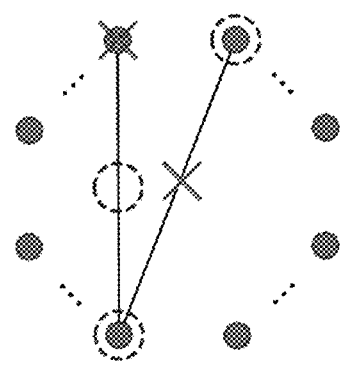

[Fig.11d]
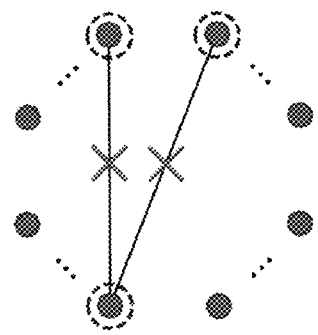
[Fig.11e]
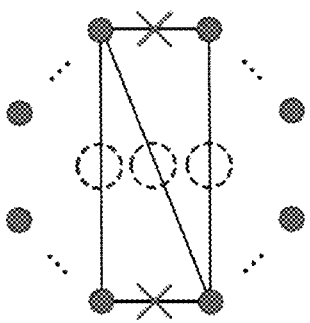
[Fig.11f]
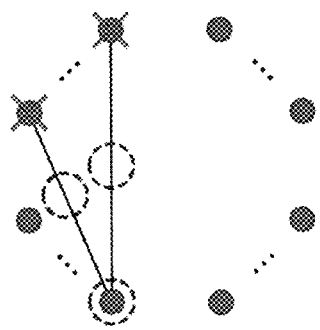

[Fig.11g]
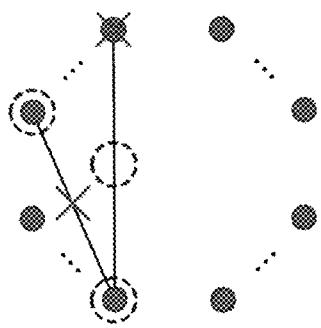
[Fig.11h]
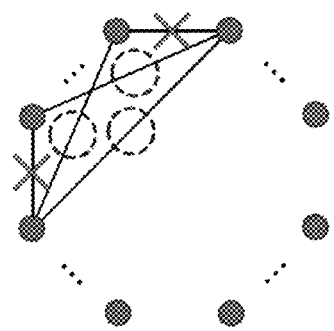
[Fig.11i]
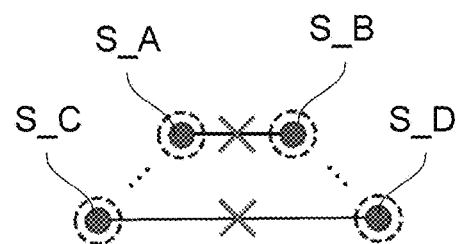
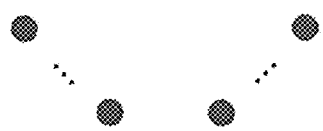

[Fig.12a]
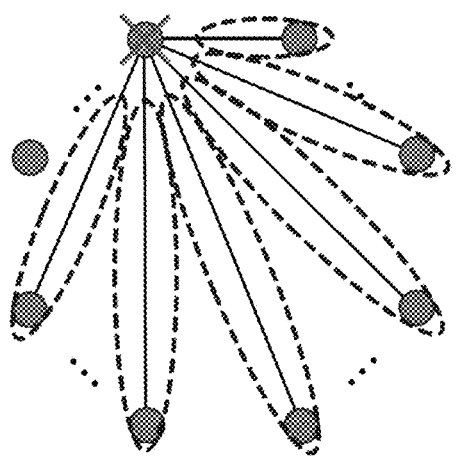
[Fig.12b]
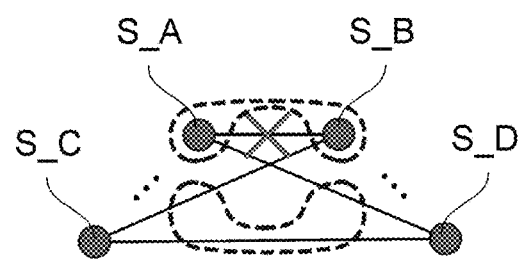
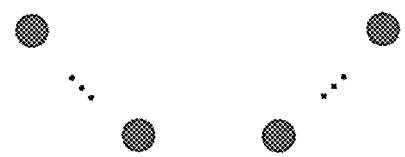

[Fig.12c]
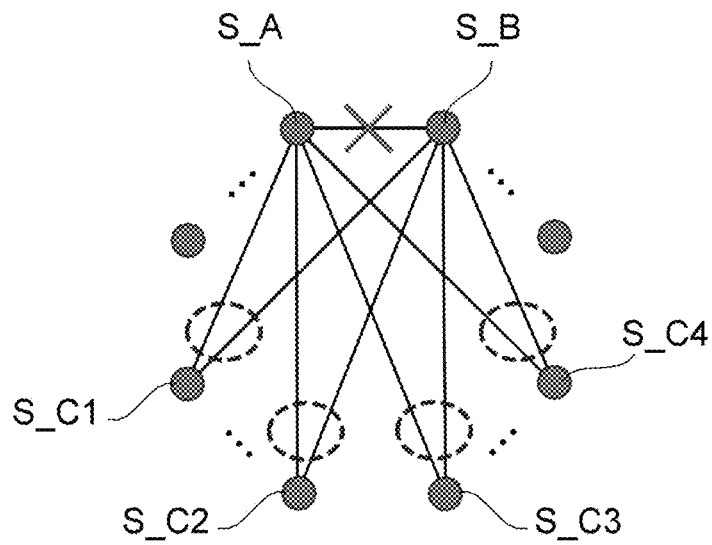
[Fig.13]
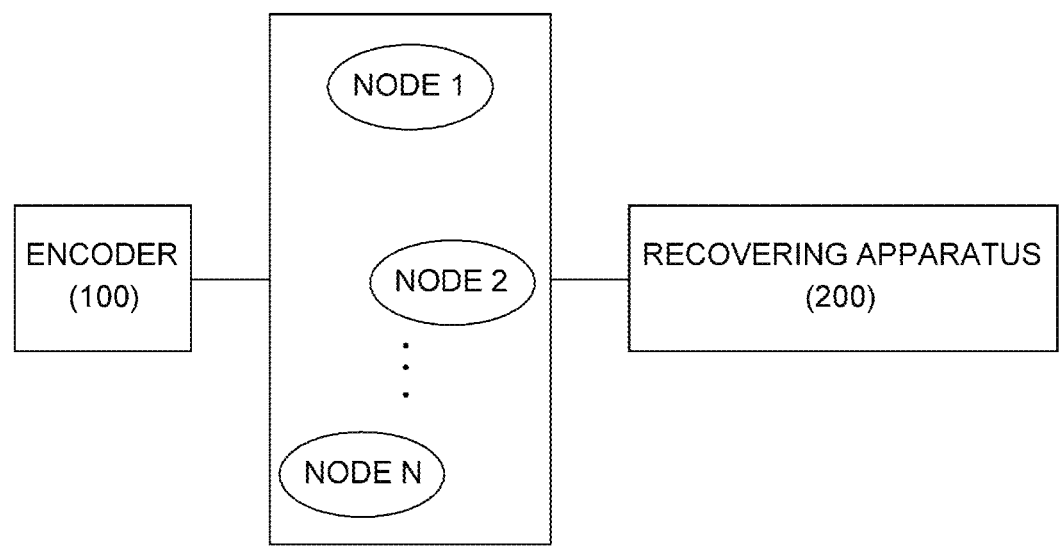

[Fig.14]
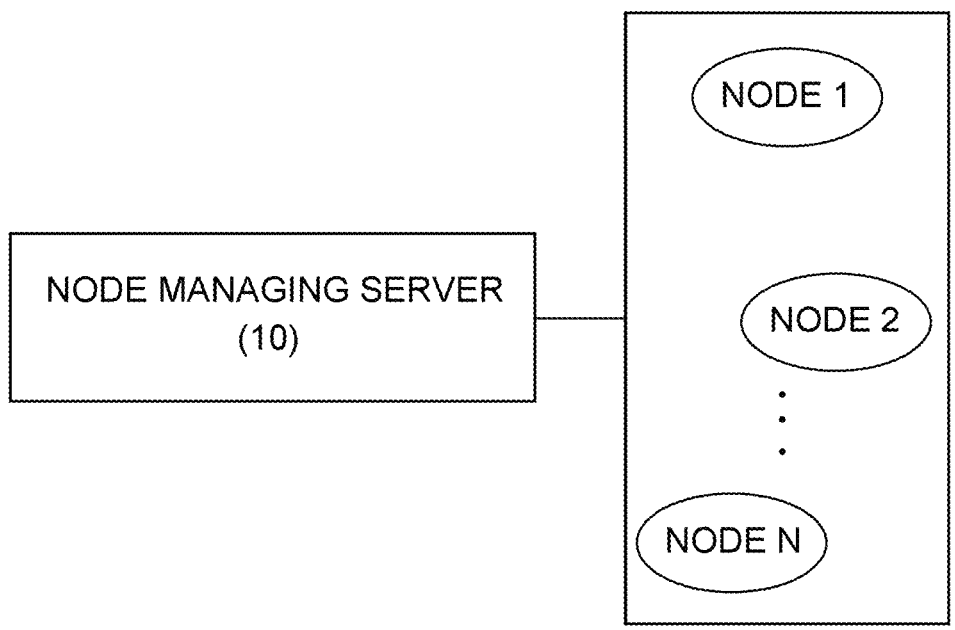
[Fig.15]
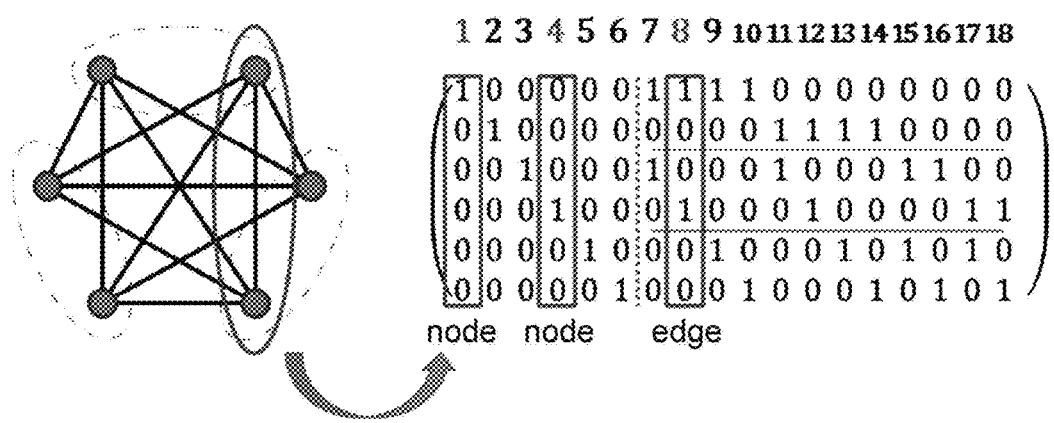

[Fig.16]
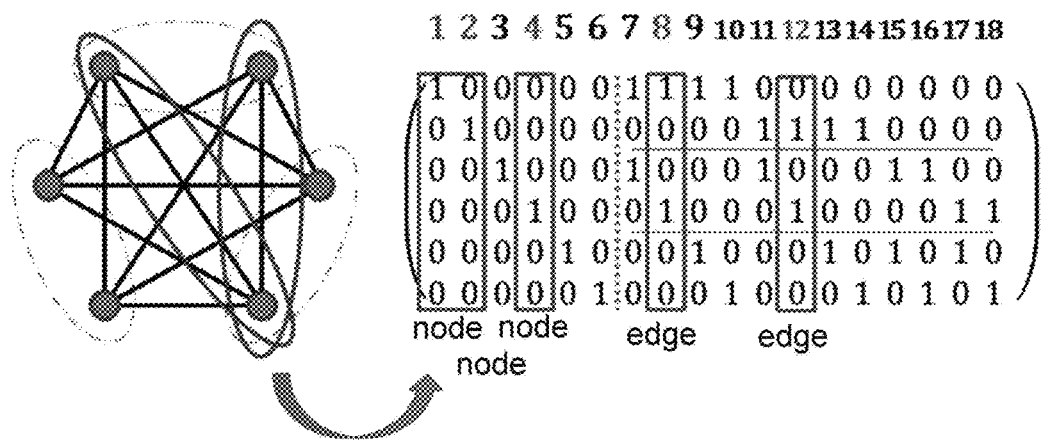

METHOD AND APPARATUS OF RECOVERING AND ENCODING FOR DATA RECOVERY IN STORAGE SYSTEM

CROSS-REFERENCE TO RELATED APPLICATIONS

This application claims priority to and the benefit of Korean Patent Application No. 10-2015-0076508 filed in the Korean Intellectual Property Office on May 29, 2015, the entire contents of which are incorporated herein by reference.

TECHNICAL FIELD

The present invention relates to a method and an apparatus of encoding for lost data recovery in a storage system and a storage system of supporting, when a node storing data is lost in a distributed storage environment, a function to recover the lost node. Particularly, the present invention relates to a method and an apparatus of encoding and recovering for data recovery in a distributed storage system.

BACKGROUND ART

A cloud storage system for safely storing and recovering big data has been introduced and actively used. For example, globally, companies including Google, Facebook, Amazon, Microsoft, and the like which provide services such as searching and providing data use the cloud storage system, that is, a distributed storage system for storing a vast amount of data.

The amount of information stored and distributed in the distributed storage system has rapidly increased due to an increase of service users and quality improvement of contents. However, in the distributed storage system, data is lost due to a defect in equipment in a distributed node or software and hardware update. Therefore, in order to restore the lost data, various types of coding techniques have been developed and used.

For example, as the most basic existing encoding method for recovering the lost data in the distributed storage system, a repetition encoding method is provided. This method makes several same copies of data and stores the copies in several distributed nodes to restore a lost node by using residual nodes even though any one of the copied nodes is lost.

An important index in data loss restoration encoding technique is a locality value indicating the minimum number of other nodes required to restore the lost nodes, which is used when some of nodes in the distributed storage system are lost.

However, the existing data loss restoration encoding techniques have an uppermost limit in that when one specific number of node is lost, only a method for guaranteeing the locality indicating the number of nodes required to restore the lost node is just proposed and jointly optimized locality cannot be guaranteed with respect to the loss of two or more of specific numbers of nodes.

SUMMARY OF THE INVENTION

The present invention has been made in an effort to guarantee jointly optimized locality with respect to various node losses and restore data of lost nodes in a distributed storage system only with low complexity when two or more of specific numbers of nodes are lost by using a method of encoding for recovering data loss in a storage system includes: a process of dividing target data to be stored into a predetermined number of data blocks; an encoding process of generating information symbols depending on the divided data blocks, selecting two different data blocks among the divided data blocks, and generating a parity symbol by using two selected data blocks; and a storing process of storing each generated symbol in each node of the storage system.

An exemplary embodiment of the present invention provides a method of encoding for recovering data loss in a storage system, including: a process of dividing target data to be stored into a predetermined number of data blocks; an encoding process of generating information symbols depending on the divided data blocks, selecting two different data blocks among the divided data blocks, and generating a parity symbol by using two selected data blocks; and a storing process of storing each generated symbol in each node of the storage system.

In the encoding process, an input matrix having an input symbol representing each of the divided data blocks as each element is multiplied by a generator matrix in which a value of the element is any one of 1 and 0 and the number of 1s included in each column vector is 2 or less to generate an output matrix, and an element corresponding to one input symbol in the output matrix and an element corresponding to the sum of two input symbols in the output matrix may be generated as the information symbol and the parity symbol, respectively.

A column vector of the generator matrix may have a length depending on the number of elements of the input matrix, and the generator matrix may be a matrix including all column vectors in which a Hamming weight is 1 and all column vectors in which the Hamming weight is 2.

The column vector of the generator matrix may have the length depending on the number of elements of the input matrix, and the generator matrix may be a matrix including all column vectors in which the Hamming weight is 1 and some of the column vectors in which the Hamming weight is 2 and include matrix components acquired by dividing matrix components constituted by a set of all column vectors in which the Hamming weight is 2 into a predetermined number of row groups and removing a column vector in which two or more rows are 1 in the same row group.

When the node of the storage system is lost, the lost node may be recovered by using the residual nodes other than the lost node.

In the encoding process, in order to decrease the number of parity symbols generated in the encoding process while maintaining the number of nodes required to recover the symbol stored in the lost node to a predetermined value, two different data blocks may be selected among the divided data blocks and the parity symbol may be encoded by using two selected data blocks.

The method may further include a recovering step of selecting, when any node is lost among the nodes of the storage system, at least one node in which acquiring the symbol stored in the lost node is available by calculating the symbol stored in the node among the residual nodes other than the lost node and recovering the symbol stored in the lost node by using the selected node.

In the encoding process, when the parity symbol is generated, some of the data blocks acquired by dividing the target data may be selected and the parity symbol may be encoded by using the selected data blocks and three or more data blocks may not be selected and only two data blocks may be selected and the parity symbol may be encoded by using two selected data blocks.

In the encoding process, when the parity symbol is generated, each parity symbol may be encoded by using two respective selected data blocks with respect to all cases in which two different data blocks are able to be selected among the data blocks acquired by dividing the target data.

When the target data is divided into k data blocks, in the encoding process, with respect to the cases of k(k−1)/2 which is the number of all cases in which k information symbols are generated and two different data blocks are able to be selected among k data blocks, k(k−1)/2 parity symbols may be generated by encoding the parity symbol by using two data blocks selected in each case.

When (k−1) nodes or less among the nodes stored in the storing process are lost, the lost nodes may be recovered by using the residual nodes other than the lost node, when one node among the nodes is lost, two nodes in which the symbol stored in the lost node is able to be acquired may be selected by calculating the symbol stored in the node among the residual nodes other than the lost node to recover one lost node, and when two nodes among the nodes are lost, three nodes in which the symbol stored in the lost node is able to be acquired may be selected by calculating the symbol stored in the node among the residual nodes other than the lost node to recover two lost nodes.

In the encoding process, when the parity symbol is generated, each parity symbol may be encoded by using each of the two selected data blocks with respect to all cases in which the data blocks acquired by dividing the target data are able to be uniformly divided into two or more predetermined groups and two data blocks that belong to different groups are able to be selected.

When the target data is divided into k data blocks and the number of groups is p, in the encoding process, k information symbols and k(k−k/p)/2 parity symbols may be each generated, and when k−k/p nodes or less are lost among the nodes stored in the storing process, the lost nodes may be recovered by using the node in which acquiring the symbol stored in the lost node is available by calculating the symbol stored in the node among the residual nodes other than the lost node.

Another exemplary embodiment of the preset invention provides a method of recovering data loss in a storage system, including: a recovering process of selecting, when any node is lost among nodes of the storage system in which an information symbol generated with respect to data blocks acquired by dividing target data to be stored into a predetermined number and a parity symbol generated by using two different data blocks among the divided data blocks are stored in each node, at least one node in which acquiring the symbol stored in the lost node is available by calculating the symbol stored in the node among the residual nodes other than the lost node and recovering the symbol stored in the lost node by using the selected node, in order to decrease the number of parity symbols generated in the encoding process while maintaining the number of nodes required to recover the symbol stored in the lost node to a predetermined value.

The storage system may store in each node the parity symbol encoded by using two respective selected data blocks with respect to all cases in which two different data blocks are able to be selected among the data blocks acquired by dividing the target data.

The recovering process may include recovering, when one node among the nodes is lost, one lost node by selecting and using two nodes in which the symbol stored in the lost node is able to be acquired by calculating the symbol stored in the node among the residual nodes other than the lost node, recovering, when two node among the nodes are lost, two lost nodes by selecting and using three nodes in which the symbol stored in the lost node is able to be acquired by calculating the symbol stored in the node among the residual nodes other than the lost node, and recovering, in the case where k−1 nodes or less are lost among the nodes when the target data is divided into k data blocks, the lost nodes by using the node in which acquiring the symbol stored in the lost node is available by calculating the symbol stored in the node among the residual nodes other than the lost node.

The storage system may store the parity symbol encoded by using two respective selected data blocks in each node with respect to all cases in which the data blocks acquired by dividing the target data are able to be uniformly divided into two or more predetermined groups and two data blocks that belong to different groups are able to be selected.

The recovering process may include recovering, when one node among the nodes is lost, one lost node by selecting and using two nodes in which the symbol stored in the lost node is able to be acquired by calculating the symbol stored in the node among the residual nodes other than the lost node, recovering, when two nodes among the nodes are lost, two lost nodes by selecting three or four nodes in which the symbol stored in the lost node is able to be acquired by calculating the symbol stored in the node among the residual nodes other than the lost node, and recovering, in the case where k−k/p nodes or less are lost among the nodes when the target data is divided into k data blocks and the number of groups is p, the lost nodes by using the node in which acquiring the symbol stored in the lost node is available by calculating the symbol stored in the node among the residual nodes other than the lost node.

The recovering process may include decoding the information symbol depending on the target data which is able to be decoded even though the symbols stored in k−k/p nodes or less are not able to be acquired by multiplying a matrix having the respective symbols stored in the nodes stored in the storage system as respective elements by a parity check matrix corresponding to an inverse matrix of a generator matrix in which values of the elements are any one of 1 and 0 and the number of is included in each column vector is 2 or less.

Yet another exemplary embodiment of the present invention provides an apparatus of encoding for recovering data loss in a storage system, including: an encoder generating an information symbol depending on divided data blocks acquired by dividing target data to be stored to be stored in the storage system into a predetermined number and generating a parity symbol by selecting two different data blocks among the divided data block s and using two selected data blocks.

Each generated symbol may be stored in each node of the storage system, and the encoder may encode the parity symbol by using two selected data blocks in order to decrease the number of parity symbols generated by the encoder while maintaining the number of residual nodes other than the lost node, which are used to recover the symbol stored in the lost node to a predetermined value when the node of the storage system is lost.

The encoder may encode each parity symbol by using two respective selected data blocks with respect to all cases in which two different data blocks are able to be selected among the data blocks acquired by dividing the target data in the case where the parity symbol is generated.

The encoder may encode each parity symbol encoded by using each of two selected data blocks with respect to all cases in which the data blocks acquired by dividing the target data are able to be uniformly divided into two or more predetermined groups and two data blocks that belong to different groups are able to be selected when the parity symbol is generated.

Still another exemplary embodiment of the preset invention provides an apparatus of recovering data loss in a storage system, including: a recovering unit selecting, when any node is lost among nodes of the storage system in which an information symbol generated with respect to data blocks acquired by dividing target data to be stored into a predetermined number and a parity symbol generated by using two different data blocks among the divided data blocks are stored in each node, at least one node in which acquiring the symbol stored in the lost node is available by calculating the symbol stored in the node among the residual nodes other than the lost node and recovering the symbol stored in the lost node by using the selected node, in order to decrease the number of parity symbols generated in the encoding process while maintaining the number of nodes required to recover the symbol stored in the lost node to a predetermined value.

According to exemplary embodiments of the present invention, in a method of encoding for recovering data loss in a distributed storage system, it is possible to guarantee jointly optimized locality with respect to a loss of two or more of specific numbers of nodes and recover data of lost nodes in the distributed storage system with low complexity by using a smaller number of nodes while using a smaller storage capacity.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 1A to 1C are reference diagrams for describing a distributed storage system in the related art.

FIG. 2 is a reference diagram illustrating a scheme in which a repetition encoding method in the related art operates.

FIG. 3 is a flowchart of a method of encoding for recovering data loss in a distributed storage system according to the present invention.

FIG. 4 is a flowchart illustrating an exemplary embodiment further including a recovering step.

FIGS. 5A to 5D are reference diagrams for describing an operation of an encoding method using a complete graph code technique according to the present invention.

FIGS. 6A, 6B, and FIGS. 7A to 7E are reference diagrams for describing locality of the encoding method using the complete graph code technique according to the present invention.

FIGS. 8A and 8B are reference diagrams for describing a minimum distance in the encoding method using the complete graph code technique according to the present invention.

FIGS. 9A and 9B are reference diagrams for describing an operation of an encoding method using a complete multipartite graph code technique according to the present invention.

FIGS. 10A, 10B and FIGS. 11A to 11I are reference diagrams for describing locality of the encoding method using the complete multipartite graph code technique according to the present invention.

FIG. 12A to 12C are reference diagrams for describing a minimum distance in the encoding method using the complete multipartite graph code technique according to the present invention.

FIG. 13 is a reference diagram illustrating a distributed storage system including the encoder and a recovering device.

FIG. 14 is a reference diagram illustrating a distributed storage system including a node management server.

FIG. 15 is a reference diagram for describing a case where one node is lost.

FIG. 16 is a reference diagram for describing a case where a plurality of nodes is lost.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, exemplary embodiments of the present invention will be described in detail with reference to the accompanying drawings. When reference numerals refer to components of each drawing, it is noted that although the same components are illustrated in different drawings, the same components are referred to by the same reference numerals as possible. Further, in the description of the present invention, the detailed descriptions of known related constitutions or functions thereof may be omitted if they make the gist of the present invention unclear. In addition, hereinafter, the exemplary embodiments of the present invention will be described, but the technical spirit of the present invention is not limited or restricted thereto and the technical spirit can be modified and variously implemented by those skilled in the art.

With the advent of a big data age, a distributed storage system using multiple nodes on a network has been developed and used in order to store massive big data. The distributed storage system means a storage system that divides original data into multiple blocks and stores the divided data in each of nodes of a cloud, which are distributed through encoding and collects data stored in the respective nodes to acquire the original data when the original data is required.

A key point in the distributed storage system is that data is distributed and stored in a plurality of nodes and thereafter, the distributed and stored data is accurately recovered to the original data again. However, as a total capacity of a storage space used in the distributed storage system significantly increases, some of storage nodes are lost or may lost due to an error in a storage hardware device, a defect of equipment in the storage system, an update of software or an error on a network. For example, in the case of Facebook, a space for storing a photo file has a size of dozens of petabytes (1024 times of terabytes) and dozens of storage nodes among thousands of storage nodes are periodically lost.

Therefore, in the distributed storage system, it is impossible to cope with the loss of the storage node only by the method that divides and stores the original data into the plurality of nodes and thereafter, collects and recovers the distributed and stored data again. Therefore, various encoding methods for dividing the original data and distributing and storing the divided original data in the nodes have been proposed so as to cope with the loss of the storage node. The encoding methods in the distributed storage system in the related art principally perform an operation of encoding separate data for data recovery at the time of dividing the original data and storing the original data in the respective nodes and thereafter, recovering, when the node is lost, the lost node by using other nodes or recovering contents of the lost node and storing the recovered contents in a substitute node.

FIGS. 1A to 1C are reference diagrams illustrating a process in which a distributed storage system in the related art divides and encodes original data and stores the divided and encoded original data in nodes distributed on a network and acquires the original data by collecting the stored original data again or when a specific node is lost, recovers the lost node.

FIG. 1A is a reference diagram illustrating a process in which the original data is divided into a predetermined number of data blocks and thereafter, stored in respective distributed nodes through an encoding process. Further, FIG. 1B is a reference diagram illustrating a process in which some (k) nodes are selected among (n) nodes distributed and present as illustrated in FIG. 1A and data is collected from the selected nodes to acquire the original data. FIG. 1C is a reference diagram illustrating a process in which when any one (for example, D1) of nodes is lost, some (d) nodes of residual D2 to Dn nodes are selected, data is collected from the selected nodes, and the data of the lost node D1 is recovered by using the collected data to be stored in a substitute node. That is, when the encoding method for recovering the data loss is used, even though some of a plurality of nodes storing the divided original data are lost, the lost nodes may be recovered by using the residual nodes and a user may acquire the original data required in the distributed storage system in which the lost nodes are periodically recovered and managed.

For example, as the most basic existing encoding method for recovering the lost data in the distributed storage system, a repetition encoding method is provided. This method makes several of the same copies of data and stores the made copies in several distributed nodes when the original data is divided to restore a lost node by using the residual nodes when any one of the copied nodes is lost. FIG. 2 is a reference diagram illustrating a scheme in which a repetition encoding method operates.

An index for evaluating the performance of the encoding method for recovering the lost data in the distributed storage system includes a collection success rate of the original data, a recovery success rate of the lost data, a storage space capacity of a distributed node, a recovery bandwidth or a coding rate, the number of access nodes for recovery, and the like. Herein, the recovery bandwidth is an index indicating the amount of data which needs to be downloaded in order to recover the lost node.

Particularly, herein, the number of access nodes for recovery means the minimum number of nodes which need to be used in order to recover a lost node and is expressed by locality. In the distributed storage system, the locality becomes the minimum number of nodes which need to be connected and used while recovering the lost node. Herein, when nodes are lost, the minimum number of nodes which need to be used to recover the l lost node may be defined as l-locality $r_l$.

For example, when any one of n nodes is lost, and as a result, a minimum of 3 nodes are required to recover the lost node, in this case, l-locality becomes 3. Since the locality is an index for determining the number of nodes required in recovering the lost node, the locality is an important index to determine the performance of the distributed storage system. When an encoding method that guarantees smaller locality is used, since only the smaller number of nodes is required to cover the lost node, the lost node may be more rapidly recovered and network traffic may be reduced.

However, the encoding method in the distributed storage system in the related art had proposed only a method that guarantees, when one specific number of node is lost, the locality (alternatively, l-locality) which is the number of nodes required to recover the lost node. However, since there are various cases in which the node is lost in the actual distributed storage system, the encoding method that guarantees the jointly optimized locality needs to be contrived.

Therefore, the present invention discloses a method of encoding for recovering data loss, which defines loss of two or more of specific numbers of nodes by joint locality representing the minimum number of nodes required to recover the loss together and guarantees the joint locality with a specific number. For example, the method of encoding for recovering data loss according to the present invention discloses an encoding method that guarantees localities 2 and 3 in the case where one node is lost and the case where two nodes are lost, respectively. In this case, the joint locality will be expressed by ($r_1=2$, $r_2=3$) Further, the method of encoding for recovering data loss according to the present invention also discloses an encoding method that guarantees localities 2 and 4 in the case where one node is lost and the case where two nodes are lost, respectively. In this case, the joint locality will be expressed by ($r_1=2$, $r_2=4$).

Hereinafter, the method of encoding for recovering data loss in the distributed storage system and an apparatus thereof according to the present invention will be described in more detail. Hereinafter, description of the distributed storage system is similarly even to a storage system storing data in at least one node. Therefore, hereinafter, the storage system storing the data in at least one node is designated as the distributed storage system and a method and an apparatus of encoding for recovering data loss will be described.

FIG. 3 is a flowchart of a method of encoding for recovering data loss in a distributed storage system according to the present invention.

The method of encoding for recovering data loss in the distributed storage system according to the present invention may include a target data dividing step (S100), an encoding step (S200), and a storing step (S300). Further, the method of encoding for recovering data loss in the distributed storage system according to the present invention may further include a recovering step (S400) as necessary. FIG. 4 is a flowchart illustrating an exemplary embodiment further including the recovering step (S400).

Operations of the target data dividing step (S100), the encoding step (S200), and the storing step (S300) to be described below in detail may be performed by an encoder 100 connected to the storage system. Herein, the encoder 100 may be a server apparatus or a computer apparatus connected to the storage system or an embedded system for performing an encoding function.

The target data dividing step (S100) divides target data to be stored into a predetermined number of data blocks.

In the encoding step (S200), the encoder 100 generates an information symbol depending on the divided data blocks, selects two different data blocks among the divided data blocks, and generates a parity symbol by using two selected data blocks.

Herein, the information symbol and the parity symbol generated as described above are collectively called a symbol.

In the encoding step (S200), the encoder 100 generates each data block as the information symbol and encodes and generates respective parity symbols with respect to two selected combinations in each of the data blocks. For example, when the target data to be stored is divided into three data blocks of A, B, and C, the encoder 100 may generate respective information symbols S_A, S_B, and S_C according to the A, B, and C blocks, respectively, and encode and generate S_(A, B), S_(B, C), and S_(A, C) as the parity symbols with respect to respective combinations of (A, B), (B, C), and (A, C) which are combinations acquired by selecting two each among the A, B, and C data blocks. Hereinafter, when X and Y are predetermined data blocks, S_X designates information symbol generated with respect to the X data block and S_(X, Y) designates a parity symbol encoded by selecting two data blocks of the X and Y data blocks and using two data blocks.

In the storing step (S300), each generated symbol is stored in each node of the distributed storage system.

That is, the symbols including the information symbol and the parity symbol generated in the encoding step (S200) may be stored in each node on the distributed storage system. Herein, each node of the distributed storage system may be nodes formed in an information storing apparatus in the distributed storage system and be connected with each other on a network.

Herein, the node storing the information symbol becomes an information node and the node storing the parity symbol becomes a parity node. Referring back to the above example, the respective symbols S_A, S_B, S_C, S_(A, B), S_(B, C), and S_(A, C) generated in the encoding step (S200) may be stored in each node of the distributed storage system.

Herein, when a specific node is lost, the node of the distributed storage system has a property to be recovered by using residual nodes other than the lost node. This has the same meaning as, in the generated symbol, when a specific symbol is lost, this the symbol which may be recovered by using residual symbols other than the lost symbol. Therefore, hereinafter, when the specific symbol is lost or the specific node is lost, in describing the method for recovering the specific symbol or the specific node, a description of the symbol may be similarly applied to the node storing the corresponding symbol and a description part of the node may be similarly applied to the symbol stored in the corresponding node. Therefore, recovering the lost node may become recovering the symbol stored in the lost node. In this case, the recovered data may be stored in an original storage node or stored in another storage place as a substitute node.

In the recovering step (S400), when any node of the nodes of the distributed storage system is lost, at least one node is selected among the residual nodes and the lost node is recovered by using the selected node.

Hereinafter, the encoding method according to the encoding step (S200) of the present invention will be described in more detail. In the encoding step (S200), the encoder 100 generates an information symbol depending on the divided data blocks, selects two different data blocks among the divided data blocks, and generates a parity symbol by using two selected data blocks. The symbols generated according to the encoding method improve an encoding rate while maintaining a predetermined joint locality value. Further, the number of nodes required to recover the lost node may be maintained to a predetermine value. Herein, improving the encoding rate may mean decreasing the number of nodes, which are stored in the distributed storage system by decreasing the number of parity symbols and decreasing the total number of nodes storing the parity symbol to be connected when the lost node is recovered. That is, while the number of nodes required to recover the symbol stored in the lost node is maintained to a predetermined value according to the encoding method of the encoding step (S200), the number of parity symbols generated in the encoding step may be decreased.

Herein, the information symbol is generated to correspond to the data block. That is, the information symbol includes all contents of the data block and further, is generated to correspond to each data block so as to acquire the contents of the corresponding data block by using the information symbol. Further, the parity symbol is encoded and generated by using the plurality of data blocks.

Herein, in the encoding step (S200), when the parity symbol is encoded by using two data blocks, the parity symbol may be encoded by adding two data blocks. Herein, the method for encoding the parity symbol is not limited to adding two data blocks and may include various methods that generate the parity symbol by using the plurality of data blocks in the distributed storage system.

In more detail, in the encoding step (S200), when the parity symbol is generated, some of the data blocks acquired by dividing the target data are selected and the parity symbol is generated by using the selected data blocks and three or more data blocks are not selected and only two data blocks are selected and the parity symbol may be generated by using two selected data blocks.

That is, for example, when the A, B, C, and D data blocks are acquired by dividing the target data to be stored, the parity symbol is generated by using not a combination of three or more data blocks such as (A, B, C) or (A, B, C, D) but only a combination of two data blocks such as (A, B) or (B, C).

The encoding method of the encoding step (S200) is advantageous in that while the number of nodes required to recover the lost node is maintained to a predetermined value, the number of generated parity symbols is decreased.

The operation of the encoding step (S200) will be described below by using an encoding technique using a generator matrix.

In the encoding step (S200), an input matrix having an input symbol representing each of the divided data blocks as each element is multiplied by a generator matrix in which a value of the element is any one of 1 and 0 and the number of 1s included in each column vector is 2 or less to generate an output matrix. Herein, the input symbol designates a symbol representing each data block and designates the 'input' symbol and the 'input' matrix in the meaning that the input matrix which is a matrix constituted by the input symbol is multiplied by the generator matrix to the output matrix.

For example, an input matrix [A, B, C] having A, B, and C representing the respective divided data blocks as the respective elements is multiplied by the generator matrix $$\begin{bmatrix} 1 & 0 & 0 & 1 & 1 & 0 \\ 0 & 1 & 0 & 1 & 0 & 1 \\ 0 & 0 & 1 & 0 & 1 & 1 \end{bmatrix}$$

in which the value of the element is any one of 1 and 0 and the number of is included in each column vector is 2 or less to generate [A, B, C, A+B, A+C, B+C] as the output matrix.

Next, in the encoding step (S200), the information symbol and the parity symbol may be generated according to the output matrix generated by using the generator matrix as described above. First, an element corresponding to one input symbol in the output matrix is generated as the information symbol. Next, an element corresponding to the sum of two input symbols in the output matrix is generated as the parity symbol.

That is, for example, A, B, or C which is the element corresponding to one input symbol may be generated as each information symbol S_A, S_B, or S_C and A+B, A+C, or B+C which is the element corresponding to the sum of two input symbols may be generated as each parity symbol S_(A, B), S_(A, C), or S_(B, C).

Herein, the generator matrix may include another matrix generated by changing a sequence of a column of the generator matrix. In other words, the generator matrix may include all matrixes which may be generated by changing a sequence among the column vectors of the generator matrix, that is, matrixes generated by all available column-permutation and any one of them may be used as the generator matrix.

In the present invention, the encoding is basically performed by such a scheme and in more detail, the present invention generally discloses two encoding methods according to the method for generating the parity symbol. The first encoding method as a method for encoding each parity symbol by using each of the two selected data blocks with respect to all cases in which two different data blocks among the data blocks acquired by dividing the target data to be stored may be selected is designated as an encoding method using a complete graph code technique. The second encoding method as a method for encoding each parity symbol by using each of the two selected data blocks with respect to all cases in which the data blocks acquired by dividing the target data to be stored is divided into at least two predetermined numbers of groups and two data blocks which belong to the different groups may be selected is designated as an encoding method using a complete multipartite graph code technique.

Hereinafter, first, the encoding method using the complete graph code technique will be described in detail.

In this case, in the encoding step (S200), each parity symbol may be encoded by using two respective selected data blocks with respect to each of all cases in which two different data blocks may be selected among the data blocks acquired by dividing the target data to be stored.

That is, for example, when the A, B, C, and D data blocks are generated by dividing the target data, the parity symbol is encoded by using the data blocks of each combination with respect to (A, B), (A, C), (A, D), (B, C), (B, D), and (C, D) which are all combinations in which two different data blocks may be selected among the data blocks. Herein, the parity symbol is not encoded with respect to the combination including three or more data blocks, that is, the combination such as (A, B, C) or (A, B, C, D) as described above.

When this is described by the encoding technique using the generator matrix, it is characterized in that the column vector of the generator matrix has a length depending on the number of elements of the input matrix and the generator matrix may be a matrix including all column vectors in which a Hamming weight is 1 and all column vectors in which the Hamming weight is 2.

Herein, the Hamming weight means the number of is included in the column vector having 0 or 1 as the element. Therefore, when the number of 1 among the elements included in the column vector is 1, the Hamming weight is 1 and when the number of 1s is 2, the Hamming weight is 2.

In the encoding method using the complete graph code technique as described below, since only two data blocks among k data blocks are selected and the parity symbol is encoded by using the selection combinations, the total number of generated parity symbols is $k^C2=k(k-1)/2$ and since the information symbol is generated for each data block, the total number of generated parity symbols is k, and as a result, n, the total number of generated symbols is $k(k-1)/2+k=k(k+1)/2$. Accordingly, the size of the generator matrix is $k\times(k(k+1)/2)$ and includes an identity matrix component having a size of k×k and a matrix component having a size of $k\times(k(k-1)/2)$ which is all column vectors in which the Hamming weight is 2, that is, all column vector components including only two 1 elements. The generator matrix of FIGS. 5A to 5D is an example of the generator matrix according to the encoding method using the complete graph code technique.

Herein, the generator matrix includes all matrixes which may be generated by the column-permutation as described above. Therefore, all matrixes which may be generated by mixing the sequences of the column vectors with respect to all column vectors in which the Hamming weight is 1 and all column vectors in which the Hamming weight is 2 may be the generator matrix.

In the encoding step (S200) according to the present invention, by generating the parity symbol as described above, the number of nodes required to recover the lost node may be first maintained to a predetermined value. Herein, particularly, in the encoding step (S200) according to the present invention, the joint locality may be maintained to $(r_1=2, r_2=3)$. In other words, the lost node (symbol) may be recovered by using at least two different nodes (symbols) when one node (symbol) is lost and at least three different nodes (symbols) when two nodes (symbols) are lost.

Second, the number of parity symbols generated in the encoding step (S200) may be decreased.

Third, in the encoding step (S200) according to the present invention, the parity symbol is encoded as described above to recover the lost node (symbol) by using other nodes (symbols) even though a maximum of k−1 nodes (symbols) are lost. In this case, a minimum distance d which is an index indicating the maximum number of recoverable lost nodes (symbols) becomes k.

In this case, when the encoding method in which k divided data blocks are generated with n symbols and the minimum distance is d is expressed by $[n,k,d]_2$ as described above, the encoding method using the complete graph code technique according to the present invention may be expressed by $[k(k+1)/2,k,k]_2$. That is, since only two data blocks among k data blocks are selected and the parity symbol is encoded by using the selection combinations in the encoding step (S200), the total number of generated parity symbols is $k^C2=k(k-1)/2$. In addition, since the information symbol is generated for each data block, the number of information symbols becomes k, and as a result, n which is the total number of generated symbols becomes $k(k-1)/2+k=k(k+1)/2$. Accordingly, the encoding method may be expressed by $[k(k+1)/2,k,k]_2$.

That is, when the target data to be stored is divided into k data blocks, in the encoding step (S200), with respect to the cases of k(k−1)/2 which is the number of all cases in which two different data blocks among k data blocks may be selected, each parity symbol is encoded by using two selected data blocks in each case.

When the operation of the encoding method using the complete graph code technique in the encoding step (S200) according to the present invention is expressed by a graph, the operation may be expressed as shown in a table of FIGS. 5A to 5D. Referring to FIGS. 5A to 5D, for example, in the case where k which is the number of divided data blocks is 4, when a graph node represents the information symbol (herein, the graph node is a concept separate from the node of the distributed storage system) and a graph edge represents each parity symbol (the parity symbol is generated by using two graph nodes connected to an edge), the symbols generated in the encoding step (S200) may be expressed as shown in the corresponding graph of FIG. 5D.

In the present invention, the encoding method of the encoding step (S200) expressed as shown in the graph of FIGS. 5A to 5D is designated as the encoding method using the complete graph code technique.

Hereinafter, a principle in which the encoding method according to the encoding step (S200) achieves three effects, that is, guaranteeing the joint locality, the decrease in number of parity symbols, and guaranteeing the minimum distance will be described and proven.

First, in the encoding step (S200) according to the present invention, by encoding the parity symbol as described above, the number of nodes (symbols) required to recover the lost node (symbol) may be maintained to a predetermined value and in more detail, the joint locality may be maintained to $(r_1=2, r_2=3)$ That is, the lost node (symbol) may be recovered by using at least two different nodes (symbols) when one node (symbol) is lost and at least three different nodes (symbols) when two nodes (symbols) are lost.

First, the fact is proven in that the lost symbol may be recovered by using at least two different symbols when one symbol is lost. FIGS. 6A and 6B are reference diagrams illustrating a proof process. In FIGS. 6A and 6B, a node (●) designates a information symbol, a edge line (−) connecting nodes (●) designates a parity symbol, a cross (✕) designates a node or edge corresponding to a lost symbol, a dotted line marked circle (○) designates a node or edge corresponding to a symbol used to recover the lost symbol. The designations are same in FIGS. 7A to 7E, FIGS. 8A, 8B, FIGS. 10A, 10B, FIGS. 11A to 11I, FIG. 12A to 12C, FIG. 15, FIG. 16. When a information symbol S_X is lost, the information symbol S_Y connected by the graph edge together with S_X and the parity symbol S_(X, Y) expressed by the graph edge connecting S_X and S_Y are present among the symbols generated according to the encoding method using the complete graph code technique. Accordingly, the S_X symbol may be recovered by using the S_Y symbol and the S_(X, Y) symbol. When the parity symbol S_(Z, Y) is lost, S_Z and S_Y corresponding to nodes to which the lost parity symbol is connected are present. Accordingly, the S_(Z, Y) symbol may be recovered by using the S_Z symbol and the S_(Z, Y) symbol. FIG. 6 illustrates 2 cases which is all cases in which one symbol may be lost in the complete graph code and in such a case, the lost symbol may be recovered by another related symbol as described above.

Next, the fact is proven in that two lost symbols may be recovered by using at least three different symbols FIGS. 7A to 7E are reference diagrams illustrating the proof process in the above case. The case where two symbols are lost, that is, the case where two nodes corresponding to the symbols are lost may include a total of five cases as illustrated in FIGS. 7A to 7E on the graph. First, referring to the case in FIG. 7A, when-information symbols S_X and S_Y are lost, the information symbols S_X and S_Z connected by the graph edge together with S_Y are present and the parity symbols S_(X, Z) and S_(Y, Z) corresponding to the graph edges connecting S_Z with S_X and S_Y are present among the symbols generated according to the encoding method using the complete graph code technique. Accordingly, the S_X and S_Y symbols may be recovered by using the S_Z symbol and the S_(X, Z) and S_(Y, Z) symbols. Even in residual cases of FIGS. 7B to 7E similarly to the case of FIG. 7A, three other symbols associated with the lost symbol (a loss shown in mark X of FIGS. 7A to 7E) may be selected (selected by a dotted line marked circle of FIGS. 7A to 7E) and two lost symbols may be recovered by using three different symbols which are selected.

As such, in the encoding step (S200) according to the present invention, the joint locality may be maintained to $(r_1=2, r_2=3)$ by encoding the parity symbol as described above.

Second, in the encoding method according to the encoding step (S200), parity symbols are generated by combining only two data blocks except for all parity symbols generated by combining three or more data blocks to decrease the number of symbols to be stored in the distributed storage system while maintaining the joint locality to $(r_1=2, r_2=3)$.

Third, in the encoding method using the complete graph code technique expressed by $[n=k(k+1)/2,k,d]_2$, the minimum distance d is guaranteed with k. That is, even though a maximum of k−1 symbols are lost, the lost symbols may be recovered by using the residual symbols. FIGS. 8A and 8B are reference diagrams for proving that a minimum distance d in the encoding method using the complete graph code technique according to the present invention is k. As verified in FIGS. 8A and 8B, symbols corresponding to each graph node and the graph edges of the graph connected as illustrated in FIGS. 5A to 5D possess (k−1) symbols sets to recover the corresponding symbols, respectively. In FIGS. 8A and 8B, the symbol sets designate symbols selected by dotted lines. In addition, in this case, the number of elements of the symbol set is 2. For example, when the symbol S_X is lost, the symbol S_X may be recovered by using a symbol set {S_(X, Y), S_Y} including S_(X, Y) and S_Y as illustrated in FIG. 8A. In addition, since the number of graph nodes is k, a total of (k−1) symbol sets are present. For example, when k information symbols are expressed by S_I1 to S_Ik, a total of (k−1) symbol sets of {S_(I1, I2), S_I2}, {S_(I1, I3), S_I3}, {S_(I1, Ik), S_Ik} are present with respect to S_I1. Further, when the symbol S_(X, Y) is lost, the lost symbol may be recovered by using a form of the symbol set {S_X, S_Y} or {S_(X, Z), S_(Y, Z)} as illustrated in FIG. 8B.

Accordingly, when (k−1) symbols are lost, a symbol set for recovering (k−1) symbols is present with respect to the respective lost symbols. In this case, when one lost symbol is recovered, the number of lost symbols becomes (k−2). Then, since (k−2) lost symbols may not occupy all of (k−1) symbol sets for recovering the specific symbol, at least one symbol set is present while being not lost. Therefore, the specific lost symbol may be recovered by using the fact and the residual lost symbols may be recovered in the same scheme. Accordingly, according to the encoding method of the encoding step (S200) in the present invention, when a maximum of (k−1) symbols are lost, the lost symbols may be recovered by using the residual symbols.

In the storing step (S300), in the case where the encoded symbol is stored in each node of the distributed storage system, the lost node may be recovered by using the residual nodes when each node is lost in the same scheme as recovering the lost symbol by using the residual symbols when each symbol is lost. That is, as repeatedly described, the description part of the symbol may be similarly applied even to the node of the distributed storage system, which is stored in the storing step (S300).

Accordingly, when (k−1) nodes or less among the nodes stored in the storing step (S300) are lost, the lost nodes may be recovered by using the residual nodes other than the lost node.

The nodes stored in the storing step (S300) has a characteristic in that when one node among the nodes is lost, one lost node may be recovered by selecting two nodes among the residual nodes other than the lost node and when two nodes among the nodes are lost, two lost nodes may be recovered by selecting three nodes among the residual nodes other than the lost nodes. That is, herein, as described above, the joint locality is guaranteed with ($r_1=2$, $r_2=3$).

In the recovering step (S400), when any node of the nodes of the distributed storage system is lost, at least one node is selected among the residual nodes other than the lost node is selected and the lost node may be recovered by using the selected node.

In this case, in the case where when the symbol is encoded by using the complete graph code technique to be stored in each node as described above, in the recovering step (S400), when k−1 nodes or less are lost among the nodes stored in the storing step (S300) as described above, the lost nodes may be recovered by using the residual nodes other than the lost nodes.

In the recovering step (S400), when one node among the nodes is lost, two nodes in which the symbol stored in the lost node may be acquired are selected by calculating the symbol stored in the node among the residual nodes other than the lost node to recover one lost node.

In the recovering step (S400), simultaneously, when two nodes among the nodes are lost, three nodes in which the symbol stored in the lost node may be acquired are selected by calculating the symbol stored in the node among the residual nodes other than the lost node to recover two lost nodes.

Hereinafter, subsequently to the encoding method using the complete graph code technique, the encoding method using the complete multipartite graph code technique which is another encoding method of the present invention will be described in detail.

In this case, in the encoding step (S200), when the parity symbol is generated, each parity symbol may be generated by using each of the two selected data blocks with respect to all cases in which the data blocks acquired by dividing the target data may be uniformly divided into two or more predetermined groups and two data blocks that belong to different groups may be selected. In other words, the data blocks are divided into a predetermined number of groups and thereafter, two data blocks that belong to different groups are selected and the parity symbol is generated by using two selected data blocks. That is, a pair of data blocks that belong to the same group are not selected and one data block is selected in each of the different groups to select a total of two data blocks.

When this is described by the encoding technique using the generator matrix, the column vector of the generator matrix has a length depending on the number of elements of the input matrix and the generator matrix may be a matrix including all column vectors in which a Hamming weight is 1 and some of the column vectors in which the Hamming weight is 2. In this case, in order to select some included in the generator matrix among the column vectors in which the Hamming weight is 2, matrix components constituted by all column vectors in which the Hamming weight is 2 are divided into a predetermined number of row groups and a part acquired by removing the column vectors in which two or more rows from the same row group are 1 may be included in the generator matrix. In other words, all column vector components in which the Hamming weight is 2 may be divided into a predetermined number of row groups having a uniform size and matrix components generated by removing column vectors in which values of two or more rows that belong to the same group are 1 from the divided row groups may be included in the generator matrix.

As described below, since two data blocks are selected among k data blocks and the parity symbol is encoded as described above in the encoding method using the complete multipartite graph code technique, k information symbols and k(k−k/p)/2 parity symbols are each generated, and as a result, n, the total number of generated symbols becomes k+k(k−k/p)/2. Accordingly, the size of the generator matrix is k×(k+k(k−k/p)/2) and includes an identity matrix component having a size of k×k and a matrix component having a size of k×(k(k−k/p)/2) as some column vectors among all column vectors in which the Hamming weight is 2. Herein, p represents the number of groups. The generator matrix of FIGS. 9A and 9B is an example of the generator matrix according to the encoding method using the complete graph code technique.

Herein, the generator matrix includes all matrixes which may be generated by the column-permutation as described above. Therefore, all matrixes which may be generated by mixing the sequences of the column vectors with respect to all column vectors in which the Hamming weight is 1 and some of the column vectors in which the Hamming weight generated by the above scheme is 2 may be the generator matrixes.

For example, when the A, B, C, and D data blocks are generated by dividing the target data to be stored and the data blocks are divided into two groups of {A, B} and {C, D}, the parity symbol is generated by using the data blocks of each combination with respect to (A, C), (A, D), (B, C), and (B, D) which are all combinations in which two data blocks that belong to different groups may be selected among the data blocks.

When the operation of the encoding step (S200) is expressed by the graph, the operation of the encoding step (S200) may be expressed as shown in a table of FIGS. 9A and 9B. Referring to FIGS. 9A and 9B, for example, in the case where k, the number of divided data blocks is 6 and p, the number of groups is 2, when the node of the graph and the edge of the graph represent the information symbol and the parity symbol, respectively, the symbol generated in the encoding step (S200) may be expressed as shown in the corresponding graph of FIG. 9A.

In the present invention, the encoding method of the encoding step (S200) expressed as shown in the graph of FIGS. 9A and 9B are designated as the encoding method using the complete multipartite graph code technique.

In the encoding step (S200) according to the present invention, by generating the parity symbol by using the encoding method using the complete multipartite graph node technique, the number of nodes required to recover the lost node may be first maintained to a predetermined value. Herein, the joint locality is guaranteed with ($r_1=2$, $r_2=4$).

Second, the number of parity symbols generated in the encoding step (S200) may be further decreased as compared with the encoding method using the complete graph code technique. Further, third, by generating the parity symbol as described above, when the number of groups is p and the number of data blocks is k, even though a maximum of (k−k/p) symbols (nodes) are lost, the lost symbols (nodes) may be recovered by using other symbols (nodes).

First, in the encoding method using the complete multipartite graph code technique, the joint locality is guaranteed with ($r_1$=2, $r_2$=4) That is, in the case where each symbol is stored in each node of the distributed storage system, when one node among the respective nodes is lost, two nodes are selected among the residual nodes other than the lost node to recover one lost node and when two nodes among the nodes are lost, four nodes are selected among the residual nodes other than the lost nodes to recover two lost nodes. In the case of the complete graph code, similarly to proving the locality value by verifying the number of other symbols required to recover the lost symbol with respect to all types of numbers in which one or two symbols are lost in FIGS. 6A, 6B and 7A to 7E, this may be proven by verifying the number of other symbols required to recover the lost symbol with respect to all types of numbers in which one or two symbols are lost in FIGS. 10A, 10B and FIGS. 11A to 11I.

In the case where one symbol is lost, when a information symbol S_X is first lost as illustrated in FIG. 10A, the information symbol S_Y connected by the graph edge together with S_X and the parity symbol S_(X, Y) expressed by the graph edge connecting S_X and S_Y are present among the symbols generated according to the encoding method using the complete multipartite graph code technique. Accordingly, the S_X symbol may be recovered by using the S_Y symbol and the S_(X, Y) symbol. Further, when the parity symbol S_(X, Y) is lost as illustrated in FIG. 10B, S_X and S_Y corresponding to nodes in which the lost parity symbol among the symbols is connected to the edges are present. Accordingly, the S_(X, Y) symbol may be recovered by using the S_X and S_Y symbols.

Similarly, when two symbols are lost, symbol loss types in all cases are illustrated in FIGS. 11A to 11I. Herein, FIG. 11I illustrates a case in which when the smallest edges are formed, parity symbols corresponding to the relevant edges are lost, and as a result, FIG. 11I illustrates a case in which the most other symbols is required for recovery and in such a case, a total of 4 symbols of S_A, S_B, S_C, and S_D are required to recover the lost symbols S_(A, B) and S_(C, D). In all of the cases of FIGS. 11A to 11H, three different symbols are required. Accordingly, it can be seen that with respect to the symbols generated according to the encoding method using the complete multipartite graph code technique, when two-symbols are lost, the lost nodes may be recovered by using a minimum of four different symbols.

In the encoding method using the complete multipartite graph code technique, the joint locality is guaranteed with ($r_1$=2, $r_2$=4).

Second, when the symbols are generated according to the encoding method using the complete multipartite graph code technique in the encoding step (S200), the target data to be stored is divided into k data blocks and when the number of groups is p, k information symbols and k(k−k/p)/2 parity symbols are each generated. The reason is that the number of parity symbols generated for each node is (k−k/p). In addition, in this case, the total number of generated symbols becomes k(k−k/p+2)/2. Accordingly, the symbols generated herein may be expressed by $[n=k(k-k/p+2)/2,k,d]_2$. In this case, the number of parity symbols is further decreased (herein, k>p) as compared with the number of parity symbols of k(k−1)/2 in the complete graph code in which k(k−1)/2 parity symbols are generated.

Third, in the encoding method using the complete multipartite graph code technique, the minimum distance d is guaranteed with (k−k/p+1). That is, even though a maximum of (k−k/p) symbols are lost, the lost symbols may be recovered by using the residual symbols. FIGS. 12A to 12C are reference diagrams for proving that the minimum distance d is k−k/p+1.

As seen in FIG. 12A, when the information symbol is lost, (k−k/p) symbol sets which may recover the corresponding information symbol are present. Further, FIGS. 12B and 12C illustrate two symbol set types to recover, when any parity symbol is lost, the corresponding parity symbol, respectively. First, the first type is a case illustrated in FIG. 12B. Herein, the lost parity symbol may be recovered by using each information symbol set {S_A, S_B} connected by the lost parity symbol S_(A, B). Further, when parity symbols S_(A, D) and S_(B, C) that connect only one of the respective information symbols S_A and S_B connected by the lost parity symbol S_(A, B) connect different information symbols S_C and S_D, respectively, the lost parity symbol may be recovered by using a {S_(A, D), S_(B_C), S_(C_D)} symbol set. In the first type, a total of k/p symbol sets are present. Next, the second type is a case illustrated in FIG. 12C. Herein, the lost parity symbol may be recovered by using two parity symbol sets connecting the respective information symbols S_A and S_B connected by the lost parity symbol S_(A, B) one by one and another information symbol (for example, S_C1, S_C2, S_C3, or S_C4) commonly with each other. In the second type, a total of (k−2k/p) symbol sets are present. Therefore, in the case where the parity symbol is lost, when both cases of the first type and the second type are summed, a total of (k−k/p) symbol sets for recovery are present. Therefore, (k−k/p) symbol sets for recovery are present in both the case in which the information symbol is lost or the parity symbol is lost. Then, even though a maximum of (k−k/p) symbols are lost, the lost symbols may be recovered by using other symbols.

In the encoded symbol storing step (S300), in the case where the encoded symbol is stored in each node of the distributed storage system, the lost node may be recovered by using the residual nodes in the same scheme as recovering the lost symbol using the residual symbols. That is, the description part of the symbol may be similarly applied even to the node of the distributed storage system, which is stored in the storing step (S300). Accordingly, when (k−k/p) nodes or less among the nodes stored in the storing step (S300) are lost, the lost nodes may be recovered by using the residual nodes other than the lost node.

In the recovering step (S400), when any node of the nodes of the distributed storage system is lost, at least one node is selected among the residual nodes other than the lost node and the lost node may be recovered by using the selected node. Herein, the recovering step (S400), the lost node may be recovered by using the nodes encoded according to the scheme described in detail in the encoding and storing steps.

Herein, in the recovering step (S400), when any node of the nodes of the storage system is lost, at least one node is selected among the residual nodes other than the lost node in which acquiring the symbol stored in the lost node is available by calculating the symbol stored in the node, and the lost node may be recovered by using the selected node.

When the symbol is encoded by using the complete multipartite graph code technique to be stored in the respective nodes, in the recovering step (S400), when one node among the nodes is lost as described above, two nodes in which the symbol stored in the lost node may be acquired are selected and used by calculating the symbol stored in the node among the residual nodes other than the lost node to recover one lost node.

In the recovering step (S400), simultaneously, when two nodes among the nodes are lost, three or four nodes in which the symbol stored in the lost node may be acquired are selected by calculating the symbol stored in the node among the residual nodes other than the lost node to recover two lost nodes.

In the recovering step (S400), in the case where k–k/p nodes or less are lost among the nodes when the target data to be stored is divided into k data blocks and the number of groups is p, the lost nodes may be recovered by using the node in which acquiring the symbol stored in the lost node is available by calculating the symbol stored in the node among the residual nodes other than the lost node.

The operation of the recovering step (S400) may be performed by a recovering apparatus 200 connected to the storage system. Herein, the recovering apparatus 200 may be a server apparatus or a computer apparatus connected to the storage system or an embedded system for performing a data recovering function.

Herein, the encoder 100 and the recovering apparatus 200 may be included in one server apparatus or computer apparatus. In this case, one server apparatus may be a node managing server 10.

FIG. 13 is a reference diagram illustrating a distributed storage system including the encoder 100 and a recovering apparatus 200 and FIG. 14 is a reference diagram illustrating a distributed storage system including a node management server 10 performing all operations of the encoder 100 and the recovering apparatus 200.

As yet another exemplary embodiment of the present invention, data loss recovering method in the distributed storage system may include recovering (S400). Herein, the recovering step (S400) in the data loss recovering method may operate similarly to the recovering step (S400) in the method of encoding for recovering data loss according to the aforementioned present invention.

Herein, in the recovering step (S400) by the data loss recovering method, when any node among nodes of a storage system in which an information symbol generated for data blocks acquired by dividing the target data to be stored into a predetermined number and a parity symbol generated by using two different data blocks among the divided data blocks are stored in the nodes, respectively, is lost in order to reduce the number of parity symbols generated in the encoding step while maintaining the number of nodes required for recovering the symbols stored in the lost node with the predetermined value, at least one node which may obtain the symbols stored in the lost node by calculating the symbols stored in the node is selected from the rest of the nodes other than the lost node and the symbols stored in the lost node may be restored by using the selected node.

First, in all cases where the storage system may select two different data blocks among the data blocks obtained by dividing the target data, the recovering (S400) operation when the parity symbol encoded by using the two selected data blocks is stored in each node will be described in more detail. In this case, as described above, the symbols encoded according to the complete graph code technique are stored in the storage system.

Herein, the recovering (S400) may include selecting the two nodes which may obtain the symbols stored in the lost node by calculating the symbols stored in the node among the nodes other than the lost node and recovering one lost node by using the two selected nodes, when one node among the nodes is lost.

The recovering (S400) may include selecting the three nodes which may obtain the symbols stored in the lost node by calculating the symbols stored in the node among the nodes other than the lost node and recovering two lost nodes by using the three selected nodes, when two nodes among the nodes are lost.

The recovering (S400) may include recovering the lost nodes using the node which may obtain the symbols stored in the lost node by calculating the symbols stored in the node among the nodes other than the lost node, in the case where k–1 or less nodes among the nodes are lost when the target data are divided into k data blocks.

Next, in all of the cases where the storage system uniformly divides the data blocks obtained by dividing the target data into at least two or more of predetermined number of groups and may select two data blocks which belong to the different groups, a case where the parity symbol encoded by using the two selected data blocks is stored in the node will be described. In this case, as described above, the symbols encoded according to the complete multipartite graph code technique are stored in the storage system.

In this case, the recovering (S400) may include selecting the two nodes which may obtain the symbols stored in the lost node by calculating the symbols stored in the node among the nodes other than the lost node and recovering one lost node by using the two selected nodes, when one node among the nodes is lost.

The recovering (S400) may include selecting the three or four nodes which may obtain the symbols stored in the lost node by calculating the symbols stored in the node among the nodes other than the lost node and recovering two lost nodes by using the three or four selected nodes, when two nodes among the nodes are lost.

The recovering (S400) may include recovering the lost nodes using the node which may obtain the symbols stored in the lost node by calculating the symbols stored in the node among the nodes other than the lost node, in the case where k–k/p or less nodes among the nodes are lost when the target data are divided into k data blocks and the number of groups is p.

In the above cases, the recovering step (S400) may include recovering the information symbol, which may be decoded even though the symbols stored in k–k/p or less of nodes may not be obtained, by multiplying a parity check matrix corresponding to a reverse matrix of a generator matrix in which an element value is either 1 or 0 and the number of 1 included in each column vector is 2 or less by a matrix in which respective symbols stored in the nodes stored in the storage system are set as respective elements.

FIGS. 15 and 16 are reference diagrams for describing the recovering step (S400) operation when each symbol is stored in each node of the storage system by performing the encoding using the generator matrix like FIG. 9B.

First, FIG. 15 is a reference diagram for describing a case where one node is lost.

Referring to FIG. 15, when a right matrix is the aforementioned generator matrix, a relation of Y1+Y4+Y8=0 is established with respect to respective symbols Y1, Y4, and Y8 which are output to correspond to each column vector of row 1, row 4, and row 8 and stored in the node. Accordingly, a relation of Y1=Y4+Y8, Y4=Y1+Y8, or Y8=Y1+Y4 is established. In this case, when losing the node storing Y1, a symbol Y1 of the lost node may be restored by using a node storing Y4 and a node storing Y8. Similarly, since Y1+Y3+Y7=0 is established, a relation of Y1=Y3+Y7, Y3=Y1+Y7, or Y7=Y1+Y3 is also established. As such, when the node storing the symbol Y1 is lost, a recovering set such as {Y3, Y7}, {Y4, Y8}, {Y5, Y9}, and {Y6, Y10} as a set which may restore the lost node may exist. Accordingly, in the recovering step (S400), the lost node may be restored by selecting symbols required for recovering by considering information of the generator matrix according to the symbol stored in the lost node and accessing the nodes storing the corresponding symbols.

Herein, a size of the recovering set may be the number of nodes required for recovering, that is, the aforementioned locality. Herein, when the number of recovering sets is 2 or more, a parallel processing when recovering the node is possible. In addition, this may be represented as availability. In an example of FIG. 15, the locality is 2 and the availability is 4.

Herein, when the number of information symbols is k, in the storage system encoded by using the complete graph, the locality is 2 and the availability is k−1, and in the storage system encoded by using the complete multipartite graph, the locality is 2 and the availability is k−k/p. Herein, p is the number of groups in the storage system encoded by using the complete multipartite graph as described above.

Next, FIG. 16 is a reference diagram for describing a case where a plurality of nodes is lost.

When a loss of maximum restorable nodes is e_max, a set of the lost nodes is E={Y1, . . . , Ye}, and when e is smaller than or equal to e_max, in this case, the recovering set may be R1 ∪ . . . ∪ Re. Herein, Rn represents a recovering set of Yn. Herein, R1 may uniquely exist and may also be multiple. In the above example, R1 exists a total of four. For example, when two nodes of Y1 and Y2 are lost, in the case of R1={Y4, Y8} and R2={Y4, Y12}, the recovering set is {Y4, Y8, Y12}. Accordingly, in this case, the lost node may be restored by accessing three nodes with respect to the loss of the two nodes.

The recovering step (S400) may operate like the aforementioned method, and with respect to the loss of all restorable nodes, the recovering set may be predetermined and stored. In addition, when the node loss occurs, the lost node may be restored by accessing the node included in the recovering set which is predetermined and stored with respect to the corresponding lost node and using the accessed node. Herein, the maximum restorable node loss e_max in the storage system encoded by using the complete graph is k−1 and in the complete multipartite graph, the e_max is k−k/p.

As yet another exemplary embodiment of the present invention, an encoding apparatus for recovering data loss in a distributed storage system is provided. The encoding apparatus for recovering data loss in a distributed storage system according to the present invention may further include an encoder 100. Herein, the encoder 100 may operate in the same scheme as the method of encoding for recovering data loss in a distributed storage system described above in detail together with FIGS. 3 to 12C. Therefore, a duplicated part will be omitted and described in brief.

The encoder 100 generates an information symbol depending on divided data blocks acquired by dividing target data to be stored in the storage system into a predetermined number and generates a parity symbol by selecting two different data blocks among the divided data blocks and using two selected data blocks.

In this case, each generated symbol is stored in each node of the distributed storage system.

Herein, when the node stored in the distributed storage system is lost, the lost node may be recovered by using the residual nodes other than the lost node.

Herein, the encoder 100 may select two different data blocks are selected among the divided data blocks and generate the parity symbol by using two selected data blocks in order to decrease the number of parity symbols generated in the encoding process while maintaining the number of nodes required to recover the symbol stored in the lost node. In more detail, the encoder 100 may encode the parity symbol by using two selected data blocks in order to decrease the number of parity symbols generated by the encoder while maintaining the number of residual nodes other than the lost node, which are required to recover the symbol stored in the lost node to a predetermined value.

Herein, when in the case where the complete graph code technique is used, the encoder 100 may encode each parity symbol by using two respective selected data blocks with respect to all cases in which two different data blocks may be selected among the data blocks acquired by dividing the target data when the parity symbol is encoded.

Herein, in the case where the complete multipartite graph code technique is used, the encoder 100 may generate, when the parity symbol is generated, each parity symbol by using each of two selected data blocks with respect to all cases in which the data blocks acquired by dividing the target data may be uniformly divided into two or more predetermined groups and two data blocks that belong to different groups may be selected.

Yet another exemplary embodiment of the present invention may become a computer program stored in a medium for performing the method of and encoding for recovering data loss in a distributed storage system described above.

As still yet another exemplary embodiment of the present invention, an apparatus for recovering data loss in a distributed storage system is provided. Herein, the apparatus for recovering data loss in a distributed storage system may include a recovering unit selecting, when any node is lost among nodes of the storage system in which an information symbol generated with data blocks acquired by dividing target data to be stored into a predetermined number and a parity symbol generated by using two different data blocks among the divided data blocks are stored in each node, at least one node in which acquiring the symbol stored in the lost node is available by calculating the symbol stored in the node among the residual nodes other than the lost node and recovering the symbol stored in the lost node by using the selected node, in order to decrease the number of parity symbols generated in the encoding process while maintaining the number of nodes required to recover the symbol stored in the lost node to a predetermined value.

Herein, the recovering unit may operate in the same scheme as the recovering step (S400) in the method of recovering data loss and become the recovering apparatus 200.

Even though all components of the exemplary embodiment of the present invention described above may be combined as one component or operate to be combined, the present invention is not limited to the exemplary embodiment. In other words, all of one or more components may be selectively combined to be operated within a scope of the present invention.

Meanwhile, the embodiments according to the present invention may be implemented in the form of program instructions that can be executed by computers, and may be recorded in computer readable media. The computer readable media may include program instructions, a data file, a data structure, or a combination thereof. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A method of encoding for recovering data loss in a distributed storage system, the method comprising:
    a process of dividing target data to be stored into a predetermined number of data blocks;
    an encoding process of generating information symbols depending on the divided data blocks, selecting two different data blocks among the divided data blocks, and generating a parity symbol by using two selected data blocks; and
    a storing process of storing each generated symbol in each node of the distributed storage system, the distributed storage system including a plurality of nodes that are connected with each other on a network.
2. The method of claim 1, wherein in the encoding process,
    an input matrix having an input symbol representing each of the divided data blocks as each element is multiplied by a generator matrix in which a value of the element is any one of 1 and 0 and the number of is included in each column vector is 2 or less to generate an output matrix, and
    an element corresponding to one input symbol in the output matrix and an element corresponding to the sum of two input symbols in the output matrix are generated as the information symbol and the parity symbol, respectively.
3. The method of claim 2, wherein a column vector of the generator matrix has a length depending on the number of elements of the input matrix, and
    the generator matrix is a matrix including all column vectors in which a Hamming weight is 1 and all column vectors in which the Hamming weight is 2.
4. The method of claim 2, wherein the column vector of the generator matrix has the length depending on the number of elements of the input matrix, and
    the generator matrix is a matrix including all column vectors in which the Hamming weight is 1 and some of the column vectors in which the Hamming weight is 2 and includes matrix components acquired by dividing matrix components constituted by a set of all column vectors in which the Hamming weight is 2 into a predetermined number of row groups and removing a column vector in which two or more rows are 1 in the same row group.
5. The method of claim 1, wherein when the node of the distributed storage system is lost, the lost node is recovered by using the residual nodes other than the lost node, and
    in the encoding process, in order to decrease the number of parity symbols generated in the encoding process while maintaining the number of nodes required to recover the symbol stored in the lost node to a predetermined value, two different data blocks are selected among the divided data blocks and the parity symbol is encoded by using two selected data blocks.
6. The method of claim 5, further comprising:
    a recovering step of selecting, when any node is lost among the nodes of the distributed storage system, at least one node in which acquiring the symbol stored in the lost node is available by calculating the symbol stored in the node among the residual nodes other than the lost node and recovering the symbol stored in the lost node by using the selected node.
7. The method of claim 5, wherein in the encoding process, when the parity symbol is generated, some of the data blocks acquired by dividing the target data are selected and the parity symbol is encoded by using the selected data blocks and three or more data blocks are not selected and only two data blocks are selected and the parity symbol is encoded by using two selected data blocks.
8. The method of claim 7, wherein in the encoding process, when the parity symbol is generated, each parity symbol is encoded by using two respective selected data blocks with respect to all cases in which two different data blocks are able to be selected among the data blocks acquired by dividing the target data.
9. The method of claim 8, wherein when the target data is divided into k data blocks, in the encoding process, with respect to the cases of $k(k-1)/2$ which is the number of all cases in which k information symbols are generated and two different data blocks are able to be selected among k data blocks, k(k−1)/2 parity symbols are generated by encoding the parity symbol by using two data blocks selected in each case.

10. The method of claim 9, wherein when (k−1) nodes or less among the nodes stored in the storing process are lost, the lost nodes are able to be recovered by the residual nodes other than the lost node,
  when one node among the nodes is lost, two nodes in which the symbol stored in the lost node is able to be acquired are selected by calculating the symbol stored in the node among the residual nodes other than the lost node to recover one lost node, and
  when two nodes among the nodes are lost, three nodes in which the symbol stored in the lost node is able to be acquired are selected by calculating the symbol stored in the node among the residual nodes other than the lost node to recover two lost nodes.

11. The method of claim 7, wherein in the encoding process, when the parity symbol is generated, each parity symbol is encoded by using each of the two selected data blocks with respect to all cases in which the data blocks acquired by dividing the target data are able to be uniformly divided into two or more predetermined groups and two data blocks that belong to different groups are able to be selected.

12. The method of claim 11, wherein when the target data is divided into k data blocks and the number of groups is p, in the encoding process, k information symbols and k(k−k/p)/2 parity symbols are each generated, and when k−k/p nodes or less are lost among the nodes stored in the storing process, the lost nodes are able to be recovered by using the node in which acquiring the symbol stored in the lost node is available by calculating the symbol stored in the node among the residual nodes other than the lost node.

13. A method of recovering data loss in a distributed storage system, the method comprising:
  a recovering process of selecting, when any node is lost among a plurality of nodes of the distributed storage system in which an information symbol generated with respect to data blocks acquired by dividing target data to be stored into a predetermined number and a parity symbol generated by using two different data blocks among the divided data blocks are stored in each node, at least one node in which acquiring the symbol stored in the lost node is available by calculating the symbol stored in the node among the residual nodes other than the lost node and recovering the symbol stored in the lost node by using the selected node, in order to decrease the number of parity symbols generated in the encoding process while maintaining the number of nodes required to recover the symbol stored in the lost node to a predetermined value,
  wherein the plurality of nodes of the distributed storage system are connected with each other on a network.

14. The method of claim 13, wherein the distributed storage system stores in each node the parity symbol encoded by using two respective selected data blocks with respect to all cases in which two different data blocks are able to be selected among the data blocks acquired by dividing the target data, and
  the recovering process includes
    recovering, when one node among the nodes is lost, one lost node by selecting and using two nodes in which the symbol stored in the lost node is able to be acquired by calculating the symbol stored in the node among the residual nodes other than the lost node,
    recovering, when two node among the nodes are lost, two lost nodes by selecting and using three nodes in which the symbol stored in the lost node is able to be acquired by calculating the symbol stored in the node among the residual nodes other than the lost node, and
    recovering, in the case where k−1 nodes or less are lost among the nodes when the target data is divided into k data blocks, the lost nodes by using the node in which acquiring the symbol stored in the lost node is available by calculating the symbol stored in the node among the residual nodes other than the lost node.

15. The method of claim 13, wherein the distributed storage system stores the parity symbol encoded by using two respective selected data blocks in each node with respect to all cases in which the data blocks acquired by dividing the target data are able to be uniformly divided into two or more predetermined groups and two data blocks that belong to different groups are able to be selected, and
  the recovering process includes
    recovering, when one node among the nodes is lost, one lost node by selecting and using two nodes in which the symbol stored in the lost node is able to be acquired by calculating the symbol stored in the node among the residual nodes other than the lost node,
    recovering, when two nodes among the nodes are lost, two lost nodes by selecting three or four nodes in which the symbol stored in the lost node is able to be acquired by calculating the symbol stored in the node among the residual nodes other than the lost node, and
    recovering, in the case where k−k/p nodes or less are lost among the nodes when the target data is divided into k data blocks and the number of groups is p, the lost nodes by using the node in which acquiring the symbol stored in the lost node is available by calculating the symbol stored in the node among the residual nodes other than the lost node.

16. The method of claim 13, wherein the recovering process includes decoding the information symbol depending on the target data which is able to be decoded even though the symbols stored in k−k/p nodes or less are not able to be acquired by multiplying a matrix having the respective symbols stored in the nodes stored in the distributed storage system as respective elements by a parity check matrix corresponding to an inverse matrix of a generator matrix in which values of the elements are any one of 1 and 0 and the number of 1s included in each column vector is 2 or less.

17. An apparatus of encoding for recovering data loss in a storage system, the apparatus comprising:
  an encoder generating an information symbol depending on divided data blocks acquired by dividing target data to be stored to be stored in the storage system into a predetermined number and generating a parity symbol by selecting two different data blocks among the divided data blocks and using two selected data blocks,
  wherein each generated symbol is stored in each node of the storage system, and
  the encoder encodes the parity symbol by using two selected data blocks in order to decrease the number of parity symbols generated by the encoder while maintaining the number of residual nodes other than the lost node, which are used to recover the symbol stored in the lost node to a predetermined value when the node of the storage system is lost.

18. The method of claim 17, wherein the encoder encodes each parity symbol by using two respective selected data blocks with respect to all cases in which two different data blocks are able to be selected among the data blocks acquired by dividing the target data in the case where the parity symbol is generated.

19. The apparatus of claim 17, wherein the encoder encodes each parity symbol encoded by using each of two selected data blocks with respect to all cases in which the data blocks acquired by dividing the target data are able to be uniformly divided into two or more predetermined groups and two data blocks that belong to different groups are able to be selected when the parity symbol is generated.

20. An apparatus of recovering data loss in a storage system, the apparatus comprising:
> a recovering unit selecting, when any node is lost among nodes of the storage system in which an information symbol generated with respect to data blocks acquired by dividing target data to be stored into a predetermined number and a parity symbol generated by using two different data blocks among the divided data blocks are stored in each node, at least one node in which acquiring the symbol stored in the lost node is available by calculating the symbol stored in the node among the residual nodes other than the lost node and recovering the symbol stored in the lost node by using the selected node, in order to decrease the number of parity symbols generated in the encoding process while maintaining the number of nodes required to recover the symbol stored in the lost node to a predetermined value.

\* \* \* \* \*